(12) United States Patent
Miura et al.

(10) Patent No.: US 10,062,758 B2
(45) Date of Patent: Aug. 28, 2018

(54) SEMICONDUCTOR DEVICE

(71) Applicant: MITSUBISHI ELECTRIC CORPORATION, Chiyoda-ku (JP)

(72) Inventors: Naruhisa Miura, Tokyo (JP); Shuhei Nakata, Tokyo (JP); Kenichi Ohtsuka, Tokyo (JP); Shoyu Watanabe, Tokyo (JP); Hiroshi Watanabe, Tokyo (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 14/463,286

(22) Filed: Aug. 19, 2014

(65) Prior Publication Data

US 2014/0353686 A1 Dec. 4, 2014

Related U.S. Application Data

(62) Division of application No. 13/638,970, filed as application No. PCT/JP2011/058805 on Apr. 7, 2011, now Pat. No. 8,860,039.

(30) Foreign Application Priority Data

Apr. 26, 2010 (JP) ................................ 2010-100553
Sep. 1, 2010 (JP) ................................ 2010-195358

(51) Int. Cl.
*H01L 29/15* (2006.01)
*H01L 29/16* (2006.01)
(Continued)

(52) U.S. Cl.
CPC ...... *H01L 29/1608* (2013.01); *H01L 29/0615* (2013.01); *H01L 29/1095* (2013.01);
(Continued)

(58) Field of Classification Search
CPC ............... H01L 29/1608; H01L 29/781; H01L 27/2454
(Continued)

(56) References Cited

U.S. PATENT DOCUMENTS 5,621,234 A    4/1997  Kato
6,693,338 B2   2/2004  Saitoh et al.
(Continued)

FOREIGN PATENT DOCUMENTS

CN    101366105 A    2/2009
CN    101393934 A    3/2009
(Continued)

OTHER PUBLICATIONS

Jaeger. Section 6: Ion Implantation [PowerPoint slides]. Retrieved from http://www-inst.eecs.berkeley.edu/~ee143/fa08/lectures/.*
(Continued)

*Primary Examiner* — Jamie C Niesz
(74) *Attorney, Agent, or Firm* — Oblon, McClelland, Maier & Neustadt, L.L.P.

(57) ABSTRACT

A semiconductor device having a low feedback capacitance and a low switching loss. The semiconductor device includes: a substrate; a drift layer formed on a surface of the semiconductor substrate; a plurality of first well regions formed on a surface of the drift layer; a source region which is an area formed on a surface of each of the first well regions and defining, as a channel region, the surface of each of the first well regions interposed between the area and the drift layer; a gate electrode formed over the channel region and the drift layer thereacross through a gate insulating film; and second well regions buried inside the drift layer below the gate electrode and formed to be individually connected to each of the first well regions adjacent to one another.

24 Claims, 23 Drawing Sheets

(51) Int. Cl.
*H01L 29/06* (2006.01)
*H01L 29/10* (2006.01)
*H01L 29/66* (2006.01)
*H01L 29/78* (2006.01)
*H01L 29/08* (2006.01)
*H01L 29/20* (2006.01)

(52) U.S. Cl.
CPC .. *H01L 29/66045* (2013.01); *H01L 29/66068* (2013.01); *H01L 29/66712* (2013.01); *H01L 29/781* (2013.01); *H01L 29/7811* (2013.01); *H01L 29/0878* (2013.01); *H01L 29/1602* (2013.01); *H01L 29/2003* (2013.01)

(58) Field of Classification Search
USPC .......................................................... 257/77
See application file for complete search history.

(56) References Cited

U.S. PATENT DOCUMENTS

| | | | |
|---|---|---|---|
| 6,781,194 B2 | 8/2004 | Baliga | |
| 6,784,486 B2 | 8/2004 | Baliga | |
| 6,791,143 B2 | 9/2004 | Baliga | |
| 6,977,414 B2 | 12/2005 | Nakamura et al. | |
| 7,816,756 B2* | 10/2010 | Saito | H01L 29/0634 257/288 |
| 8,222,649 B2 | 7/2012 | Miura et al. | |
| 2002/0185705 A1 | 12/2002 | Saitoh et al. | |
| 2004/0094819 A1 | 5/2004 | Saitoh et al. | |
| 2004/0099905 A1 | 5/2004 | Baliga | |
| 2004/0232479 A1 | 11/2004 | Baliga | |
| 2005/0001268 A1 | 1/2005 | Baliga | |
| 2005/0032291 A1 | 2/2005 | Baliga | |
| 2005/0156242 A1* | 7/2005 | Yamaguchi | H01L 21/84 257/347 |
| 2005/0230781 A1* | 10/2005 | Ema | H01L 21/823412 257/510 |
| 2007/0132012 A1* | 6/2007 | Saito | H01L 29/0634 257/327 |
| 2007/0228462 A1 | 10/2007 | Saito | |
| 2008/0246096 A1 | 10/2008 | Sakakibara et al. | |
| 2008/0315297 A1* | 12/2008 | Takashita | H01L 21/26513 257/328 |
| 2009/0078942 A1 | 3/2009 | Kono et al. | |
| 2010/0219417 A1* | 9/2010 | Miura | H01L 29/0615 257/77 |
| 2011/0284874 A1 | 11/2011 | Miura et al. | |
| 2013/0009256 A1 | 1/2013 | Okumura et al. | |
| 2013/0020587 A1 | 1/2013 | Hino et al. | |

FOREIGN PATENT DOCUMENTS

| | | |
|---|---|---|
| DE | 100 08 570 A1 | 9/2001 |
| JP | 64-39069 | 2/1989 |
| JP | 3-230574 | 10/1991 |
| JP | 5-102487 | 4/1993 |
| JP | 2003-86800 | 3/2003 |
| JP | 2004-22693 | 1/2004 |
| JP | 2004-241768 | 8/2004 |
| JP | 2004-537162 | 12/2004 |
| JP | 2005-333068 A | 12/2005 |
| JP | 2007-150142 | 6/2007 |
| JP | 2007-243092 | 9/2007 |
| JP | 2007-281034 | 10/2007 |
| JP | 2008-258313 | 10/2008 |
| JP | 2009-130244 | 6/2009 |
| JP | 2011-211020 | 10/2011 |
| WO | WO 2009/099182 A1 | 8/2009 |

OTHER PUBLICATIONS

Combined Chinese Office Action and Search Report dated Sep. 26, 2014, in Patent Application No. 201180020961.3 with partial English translation.
Office Action dated Apr. 17, 2014 in Korean Patent Application No. 10-2012-7027337 (with partial English language translation).
Office Action dated Oct. 13, 2013 in Korean Patent Application No. 10-2012-7027337 (with partial English language translation).
Office Action dated Jan. 21, 2014 in Japanese Patent Application No. 2012-512749 (with partial English language translation).
International Search Report dated Jul. 12, 2011 in Application No. PCT/JP2011/058805.
International Preliminary Report on Patentability and Written Opinion of the International Searching Authority dated Oct. 30, 2012 in PCT/JP2011/058805 (w/English translation).
International Preliminary Report on Patentability dated Dec. 4, 2012 in PCT/JP2011/058805.
Office Action dated Aug. 18, 2015 in Japanese Patent Application No. 2014-185212 with partial English translation.
U.S. Appl. No. 13/639,738, filed Oct. 5, 2012, 2013-0020587, Hino, et al.
U.S. Appl. No. 14/789,364, filed Jul. 1, 2015, Miura, et al.
Office Action dated Feb. 19, 2016 in German Patent Application No. 11 2011 101 442.2 with partial English translation.

* cited by examiner

F I G . 1
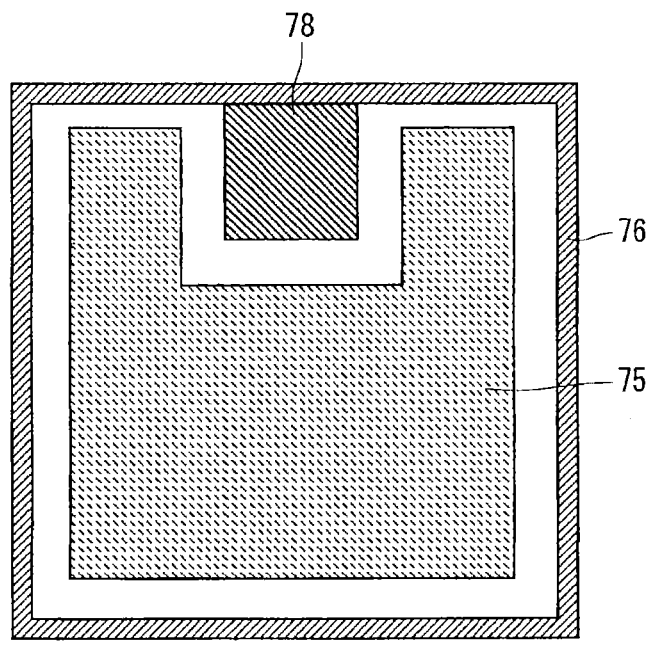
F I G . 2
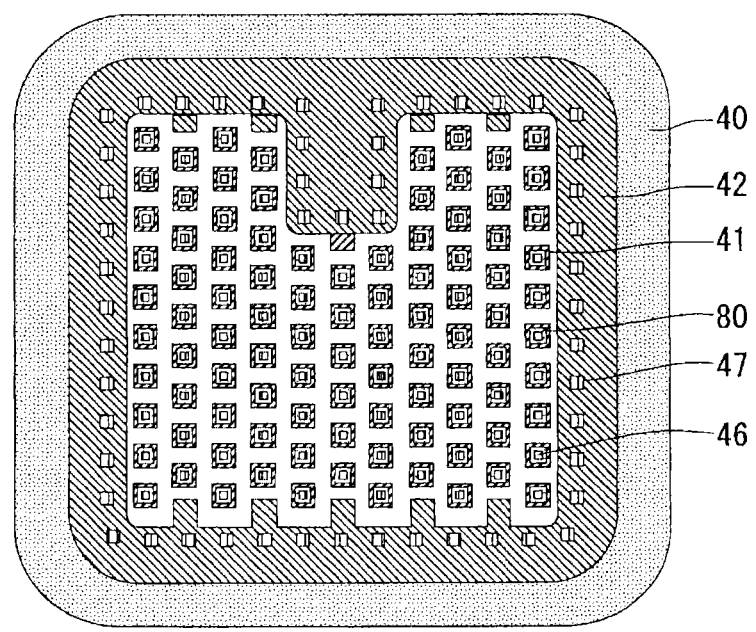

F I G . 1 6
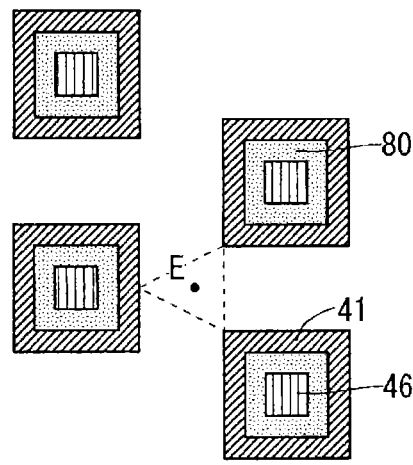
F I G . 1 7
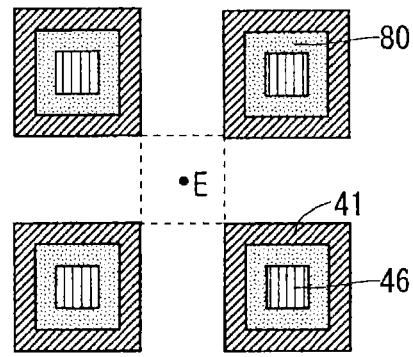
F I G . 1 8
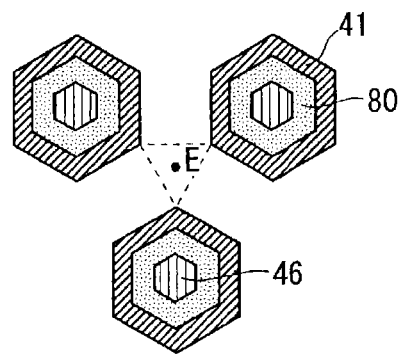

F I G . 2 8
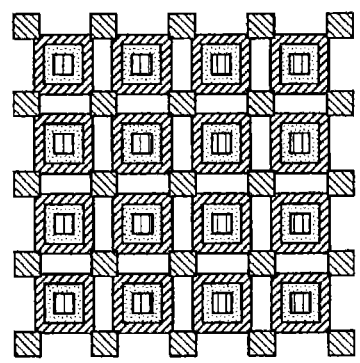
F I G . 2 9
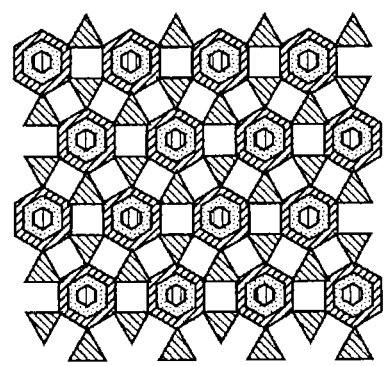

F I G. 4 1
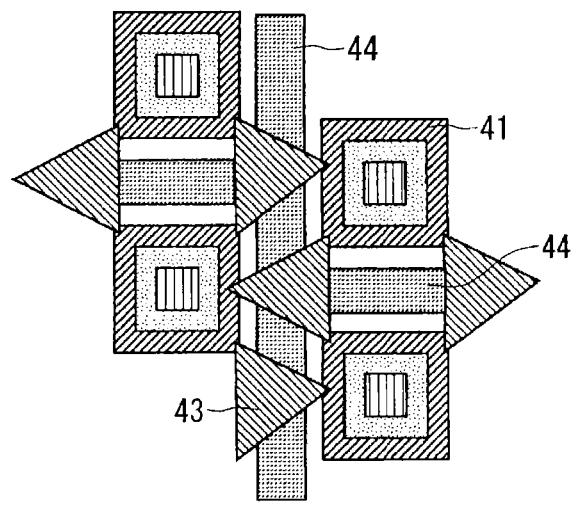
F I G. 4 2
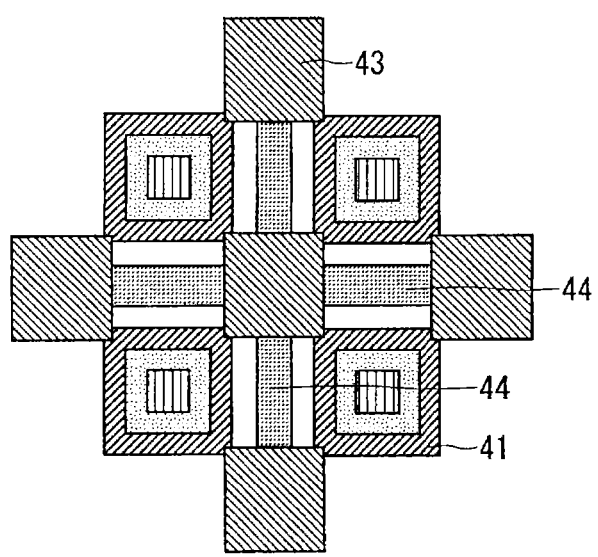

F I G . 5 1
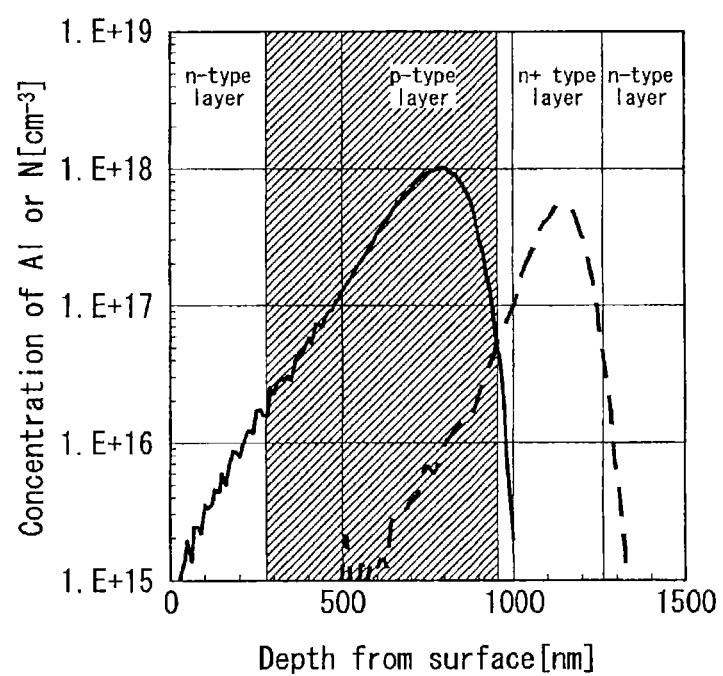

SEMICONDUCTOR DEVICE

CROSS-REFERENCE TO RELATED APPLICATION

This application is a divisional application of and claims the benefit of priority from U.S. application Ser. No. 13/638,970, filed Oct. 2, 2012, which is a 371 of PCT international application Serial No. PCT/JP2011/058805, filed Apr. 7, 2011, which designates the United States, and which claims the benefit of priority from Japanese Patent Application No. 2010-100553 filed Apr. 26, 2010 and Japanese Patent Application No. 2010-195358 filed Sep. 1, 2010; the entire contents of each of the above are incorporated herein by reference.

TECHNICAL FIELD

The present invention relates to a semiconductor device, and particularly to a feedback capacitance, an ON-state power loss, and a switching loss of a silicon carbide semiconductor device.

BACKGROUND ART

In a silicon carbide semiconductor device, it has been conventionally demanded to reduce a loss when power is applied (ON-state power loss), and reduce a loss caused during switching of the device (switching loss).

Named as a method to solve this is to reduce a feedback capacitance that depends on a facing area between a drain electrode and a gate electrode. Specifically, as indicated in Patent Document 1, this is a method to reduce an area (JFET region) between a p-base layer and a p-base layer constituting individual unit cells by insertion of p-extraction regions.

According to an n-channel DMOS (Double Diffused MOS) which is a silicon carbide semiconductor device indicated in Patent Document 1, a p-base layer constituting each unit cell is partially connected in the p-extraction region between the unit cells so as to short-circuit the p-base layer to a source electrode through the p-extraction region. With this structure, a noise applied to an element can be also passed to a path leading to the source electrode through the p-extraction region, and a breakdown voltage of the element can be also improved. Further, since the p-region continuously forms one region in the entire element, a local potential increase of the p-base layer is suppressed, and the breakdown voltage of the element can also be improved.

PRIOR ART DOCUMENT

Patent Document

Patent Document 1: Japanese Patent Application Laid-Open No. 05-102487 (1993)

SUMMARY OF INVENTION

Problem to be Solved by the Invention

However, the p-extraction regions are connected in the vicinity of a surface of the p-base layer and are extended from a surface of a drift layer in a direction deep inside the drift layer. Accordingly, an effective channel width of each of the unit cells is reduced, the JFET region is partially reduced, and although a feedback capacitance can be reduced as compared with a case in which the p-extraction regions are not provided, this causes a problem of increased channel resistance and JFET resistance.

The present invention is made to solve the foregoing problem, and an object of the present invention is to provide a semiconductor device that can reduce a feedback capacitance, an ON-state loss, and a switching loss without causing an increase in a channel resistance and a JFET resistance.

Means for Solving the Problem

A semiconductor device according to the present invention includes: a semiconductor substrate of a first conductivity type; a drift layer of the first conductivity type formed on a surface of the semiconductor substrate; a plurality of first well regions of a second conductivity type formed selectively on a surface of the drift layer; a source region of the first conductivity type which is an area formed selectively on a surface of each of the first well regions and defining, as a channel region, the surface of each of the first well regions interposed between the area and the drift layer; a gate electrode formed over the channel region and the drift layer thereacross through an insulating film; a plurality of second well regions of the second conductivity type buried inside the drift layer below the gate electrode, and partially connecting a region among the plurality of first well regions in plan view; a source electrode connected to the source region and formed to be directly connected to only the first well regions between the first and second well regions; and a drain electrode formed on a rear surface of the semiconductor substrate.

Effect of Invention

According to the semiconductor device of the present invention, the semiconductor device includes: a semiconductor substrate of a first conductivity type; a drift layer of the first conductivity type formed on a surface of the semiconductor substrate; a plurality of first well regions of a second conductivity type formed selectively on a surface of the drift layer; a source region of the first conductivity type which is an area formed selectively on a surface of each of the first well regions and defining, as a channel region, the surface of each of the first well regions interposed between the area and the drift layer; a gate electrode formed over the channel region and the drift layer thereacross through an insulating film; a plurality of second well regions of the second conductivity type buried inside the drift layer below the gate electrode, formed to be individually connected to the first well regions adjacent to one another, and partially connecting a region among the plurality of first well regions in plan view; a source electrode connected to the source region and formed to be directly connected to only the first well regions between the first and second well regions; and a drain electrode formed on a rear surface of the semiconductor substrate. Accordingly, it is possible to reduce a feedback capacitance, an ON-state loss, and a switching loss without causing an increase in a channel resistance and a JFET resistance.

These and other objects, features, aspects, and advantages of the present invention will become more apparent from the following detailed description of the present invention when taken in conjunction with the accompanying drawings.

BRIEF DESCRIPTION OF DRAWINGS

FIG. 1 is a top view of a silicon carbide semiconductor device according to Embodiment 1.

FIG. 2 is a top view of a vicinity of a surface inside a substrate of the silicon carbide semiconductor device according to Embodiment 1.

FIG. 16 is a top view of the silicon carbide semiconductor device according to Embodiment 1.

FIG. 17 is a top view of a modified example of the silicon carbide semiconductor device according to Embodiment 1.

FIG. 18 is a top view of a modified example of the silicon carbide semiconductor device according to Embodiment 1.

FIG. 28 is a top view of a modified example of the silicon carbide semiconductor device according to Embodiment 1.

FIG. 29 is a top view of a modified example of the silicon carbide semiconductor device according to Embodiment 1.

FIG. 41 is a top view of a silicon carbide semiconductor device according to Embodiment 3.

FIG. 42 is a top view of a modified example of the silicon carbide semiconductor device according to Embodiment 3.

FIG. 51 is a diagram indicating an impurity concentration distribution of the silicon carbide semiconductor device manufactured according to Embodiment 4.

EMBODIMENT FOR CARRYING OUT THE INVENTION

Figure 3:
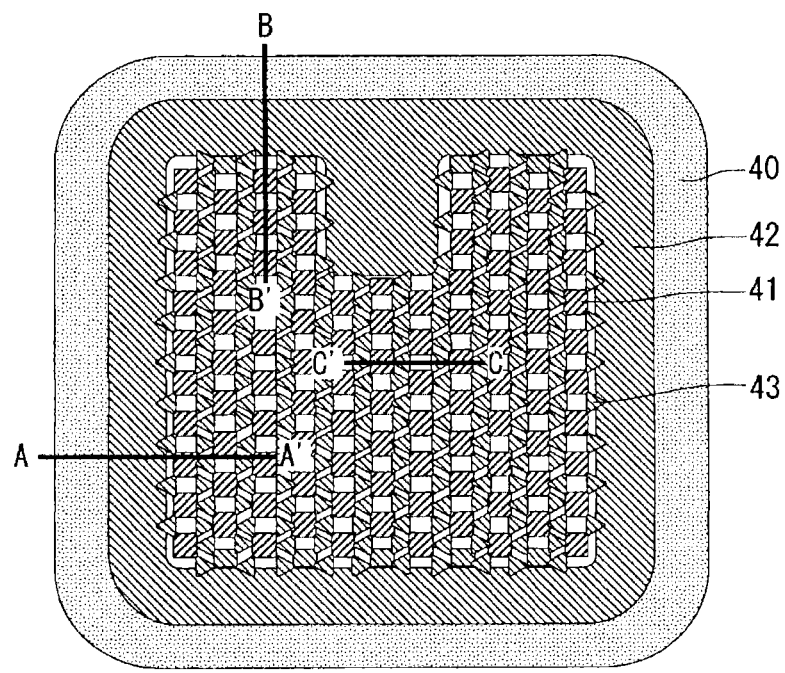
FIG. 3 is a top view illustrating inside the substrate of the silicon carbide semiconductor device according to Embodiment 1.

In the description hereinafter, with respect to a conductivity type of an impurity, an n-type is generally defined as a "first conductivity type", and a p-type is generally defined as a "second conductivity type". However, this may be defined in an opposite way.

A. Embodiment 1

<A-1. Structure>

FIG. 1 is a top view schematically illustrating an upper surface structure of a silicon carbide semiconductor device according to Embodiment 1, and more particularly illustrating an upper surface structure of a silicon carbide MOSFET including a switching element having a MOS structure constituted of a cell structure.

A gate pad 78 to which a gate voltage is applied from an external control circuit (not illustrated) is formed in an upper end center portion on one side surface among four side surfaces of the device. In addition, a plurality of unit cells each of which is a smallest unit structure of a MOSFET are arranged in rows parallel to one another in an active region, and a source pad 75 to which source electrodes of the unit cells are connected in parallel is formed in the active region. Gate wiring 76 is formed by being connected to the gate pad 78 around the source pad 75. A gate voltage to be applied to the gate pad 78 is supplied to a gate electrode (not illustrated) of each of the unit cells through the gate pad 78 and the gate wiring 76.

In an ordinary product, there are many cases where electrodes for a temperature sensor and a current sensor are formed in a semiconductor element. However, the presence or absence of such electrodes does not affect the effect of an element which will be described later. In addition, there are variety of cases of a position and a quantity of the gate pad 78, a shape of the source pad 75, and the like according to the MOSFET. However, as in the case of the above-mentioned electrode for the current sensor and the like, it does not affect the effect of the device which will be described later.

FIG. 2 is a top view schematically illustrating a vicinity of a topmost surface inside silicon carbide of the silicon carbide MOSFET according to Embodiment 1. A source region 80 of the first conductivity type and a well contact region 46 of the second conductivity type are arranged in each of first well regions 41 of the second conductivity type which are isolated from one another.

A group of the first well regions 41 is surrounded by a peripheral region 42 of the second conductivity type so as to be encompassed, and, further, the peripheral region 42 is surrounded by a JTE region 40 of the second conductivity type which is the termination of the element. A well contact region 47 of the second conductivity type for making ohmic connection to the source electrode (not illustrated) is provided in the peripheral region 42.

A JFET region is present in a gap region of the first well region 41, and is one of paths through which an ON-state current flows when the device is in an ON-state operation. The JFET region is identified using reference numeral 45 in FIG. 15. Further, this gap region is one of factors that determine a value of a capacitance (feedback capacitance) between the gate electrode (not illustrated) formed thereabove and the drain electrode (not illustrated) formed on a reverse side thereof.

This Embodiment 1 describes an aspect in which the unit cells are square and arranged in rows where the unit cells are deviated by half a pitch as compared with adjacent rows as illustrated in FIG. 2. However, the arrangement is not limited to this, and the unit cells may be rectangular or hexagonal, and the effect of the present invention does not change even if the unit cells are aligned at equal intervals lengthwise and breadthwise.

FIG. 3 is a top view schematically illustrating the silicon carbide MOSFET according to Embodiment 1 at a distance from a surface of silicon carbide, that is, at a depth substantially corresponding to the first well region 41. Here, second well regions 43 of the second conductivity type are formed in a manner to connect the first well regions 41 to one another.

The second well regions 43 are provided only inside the semiconductor substrate and are provided in a part of the JFET region. By providing the second well regions 43, an opening area of the JFET region is reduced and thereby the feedback capacitance is reduced. The second well regions 43 are arranged to cover at least a position on a projected plane on a surface of the substrate in which a gate electric field strength becomes the highest when a reverse bias is applied to the element, and a planar structure thereof can take various forms as will be described later.

Figure 4:
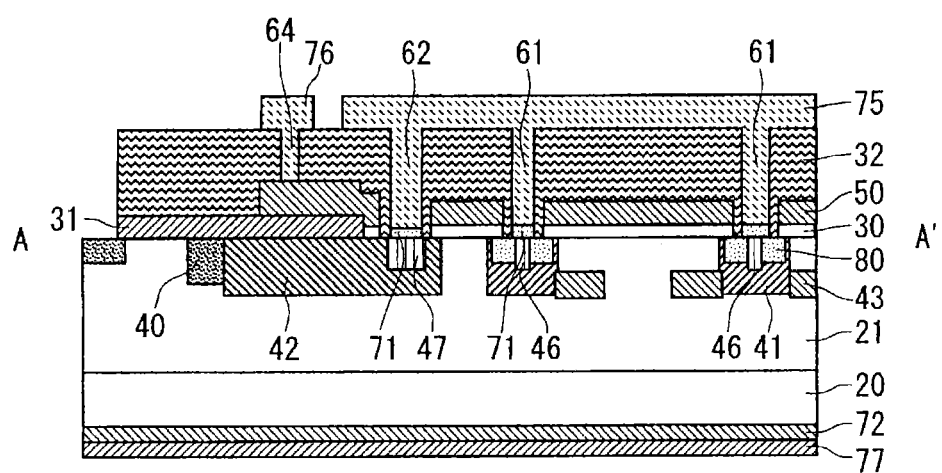
FIG. 4 is a longitudinal sectional view of an end surface of an element of the silicon carbide semiconductor device according to Embodiment 1.
Figure 5:
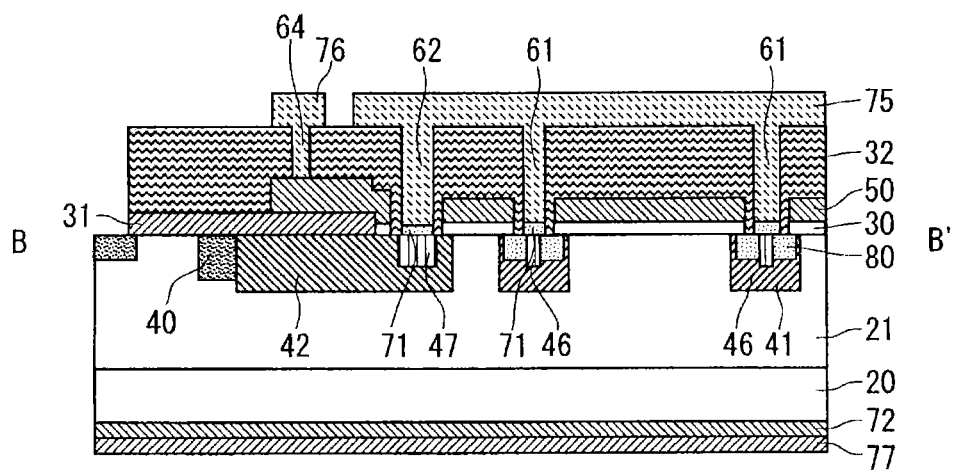
FIG. 5 is a longitudinal sectional view of an end surface of an element of the silicon carbide semiconductor device according to Embodiment 1.

FIGS. 4 and 5 are longitudinal cross sectional views schematically illustrating cross sections taken along a line A-A' in FIG. 3 and a line B-B' in FIG. 3, respectively. As illustrated in FIG. 4, the silicon carbide MOSFET according to the present invention includes: a first drift layer 21 of the first conductivity type formed on a surface of a semiconductor substrate 20 of the first conductivity type; an ohmic electrode 72 and a drain electrode 77 formed on a reverse side of the semiconductor substrate 20; a plurality of first well regions 41 of the second conductivity type selectively formed on a surface of the drift layer 21; a source region 80 of the first conductivity type selectively formed on a surface of the first well region 41 and defining, as a channel region, a surface of the first well region 41 interposed between the source region 80 and the drift layer 21; a well contact region 46 of the second conductivity type formed in the first well region 41 and the source region 80; second well regions 43 of the second conductivity type buried inside the drift layer 21 under a gate electrode 50 and formed to be individually connected to the first well regions 41 adjacent to one another; a peripheral region 42 of the second conductivity type selectively formed to surround the cell region including the first well region 41 on the surface of the drift layer 21 in a plan view, and connected to a source electrode (source pad 75); a well contact region 47 of the second conductivity type formed on a surface of the peripheral region 42; a JTE region 40 of the second conductivity type formed on the surface of the drift layer 21 in a manner to surround the peripheral region 42; a gate insulating film 30 formed on the surface of the drift layer 21 in a manner to cover a part of the first well region 41 and the peripheral region 42; a field oxide film 31 formed on the surface of the drift layer 21 where the gate insulating film 30 is not formed; a gate electrode 50 formed over the channel region and the drift layer 21 thereacross through the gate insulating film 30 and the filed oxide film 31; an interlayer dielectric film 32 formed on the gate electrode 50 and the field oxide film 31; a gate contact hole 64 penetrating through the interlayer dielectric film 32 and reaching the gate electrode 50; gate wiring 76 formed on the gate contact hole 64; a well contact hole 62 penetrating through the interlayer dielectric film 32 and the gate electrode 50 and reaching an ohmic electrode 71 formed on the well contact region 47; source contact holes 61 penetrating through the interlayer dielectric film 32 and the gate electrode 50, and individually reaching the ohmic electrode 71 formed on the well contact region 46; and a source pad 75 formed on the source contact holes 61. To state it differently, the source pad 75 is a source electrode that is formed to be connected to the source region 80 and directly connected only to the first well region 41 and the peripheral region 42.

The second well region 43 is connected to the first well region 41 and the peripheral region 42 in a position away from the surface of the drift layer 21 of the first conductivity type. Further, according to the layout of the unit cells illustrated in FIG. 2, the second well region 43 has different cross sectional shapes depending on directions of the cross sections as illustrated in FIGS. 4 and 5.

The case illustrated in FIG. 5 has a different direction of the cross section from the case illustrated in FIG. 4. However, they are substantially similar to each other except that the cross section of the second well region 43 is not present in FIG. 5, and therefore detailed descriptions thereof will be omitted.

<A-2. Manufacturing Method>

Next, a description will be given of a manufacturing method of the silicon carbide semiconductor device according to Embodiment 1, and, in particular, of a manufacturing method of the silicon carbide MOSFET with reference to the schematic longitudinal cross sectional views illustrated in FIGS. 6 to 15. The longitudinal cross sectional views in FIGS. 6 to 15 are illustrated at positions where an element termination portion is not included, and many unit cells are arranged, for example, longitudinal cross sections at a position taken along a line C-C' in FIG. 3.

First, the semiconductor substrate 20 made of silicon carbide of the first conductivity type is prepared. Other than silicon carbide, a wide bandgap semiconductor having a larger bandgap as compared with silicon may be used for the semiconductor substrate 20. For example, GaN, diamond, or the like is provided other than silicon carbide as the wide bandgap semiconductor. The semiconductor substrate 20 may be inclined by 8 degrees or less with respect to a c-axis, or may not be inclined. Whatever plane direction it has, it does not affect the effect of Embodiment 1.

The drift layer 21 of the first conductivity type formed of an epitaxial crystal growth layer (an impurity concentration thereof is, for example, in a range between $1\times10^{13}$ cm$^{-3}$ and $1\times10^{18}$ cm$^{-3}$, and a thickness thereof ranges from 4 μm to 200 μm) is provided above the semiconductor substrate 20.

Figure 6:
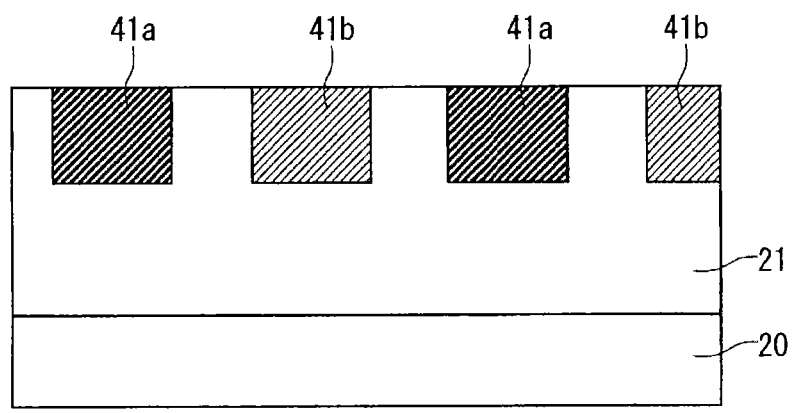
FIG. 6 is a longitudinal sectional view in a manufacturing method of the silicon carbide semiconductor device according to Embodiment 1.

Thereafter, referring to FIG. 6, an impurity is ion-implanted using a resist mask, an oxide film mask, or the like processed by photolithography to form a first well region 41a of the second conductivity type. FIG. 6 illustrates, to facilitate understanding, a first well region 41b which is present in a position where a row of the unit cells is deviated by half a pitch from this cross section.

The semiconductor substrate 20 during implantation may not be actively heated or may be heated at a temperature ranging from 200° C. to 800° C. In addition, nitrogen or phosphorus is preferable as the impurity to be implanted if the conductivity type is the n-type, and aluminum or boron is preferable if the conductivity type is the p-type.

Further, it is necessary to set a depth of the first well region 41a so that it does not go beyond a bottom surface of the drift layer 21, and the depth is set to a value ranging, for example, from 0.3 μm to 2.0 μm. The impurity concentration of the first well region 41a exceeds the impurity concentration of the drift layer 21, and is set to a value ranging, for example, from $1\times10^{15}$ cm$^{-3}$ to $1\times10^{19}$ cm$^{-3}$. However, as far as the vicinity of the topmost surface of the drift layer 21 is concerned, the impurity concentration of the first well region 41a may be lower than the impurity concentration of the drift layer 21 so as to increase the conductivity of the channel region of the silicon carbide semiconductor device.

Figure 7:
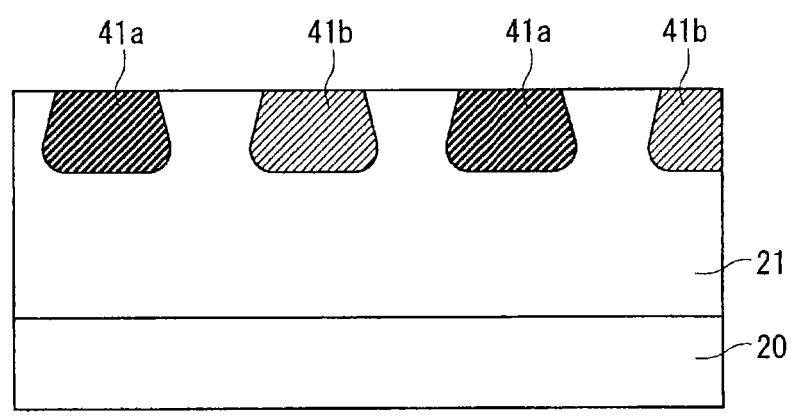
FIG. 7 is a longitudinal sectional view of a modified example in a manufacturing method of the silicon carbide semiconductor device according to Embodiment 1.
Figure 8:
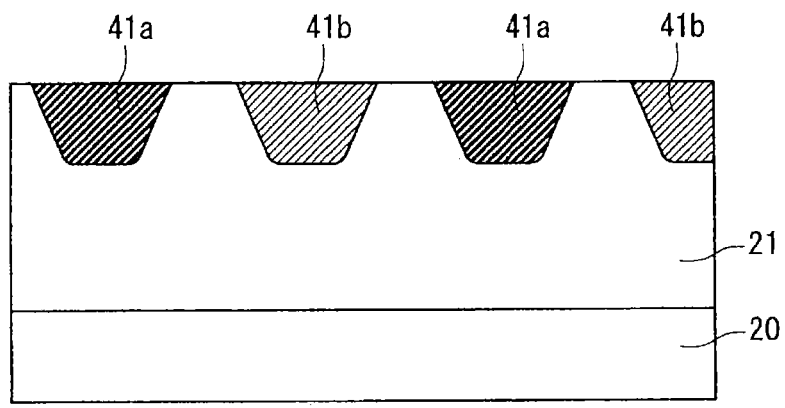
FIG. 8 is a longitudinal sectional view of a modified example in the manufacturing method of the silicon carbide semiconductor device according to Embodiment 1.

The distribution of the first well region 41a may be a shape that more widens transversely in a depth direction (inverse tapered shape) as illustrated in FIG. 7 or may be a shape that narrows transversely in the depth direction (tapered shape) as illustrated in FIG. 8. Particularly, when the first well region 41a is formed by the impurity ion implantation so that the impurity on a side of the topmost surface thereof becomes lean and the impurity on a side of a depth becomes concentrated, dispersion of the implanted impurity in a transverse direction on the side of the depth becomes larger. Therefore, the structure illustrated in FIG. 7 can be easily obtained.

Next, although this is not illustrated, the peripheral region 42 of the second conductivity type and the JTE region 40 of the second conductivity type are also formed by the impurity ion implantation in a similar manner. Here, if the concentration of the impurity and the depth of implantation are identical between the first well region 41 and the peripheral region 42, patterning may be performed by a single photolithographic process, which leads to a reduction in the number of processes and a cost of a chip. Alternatively, they may not be identical. To state it differently, in the peripheral region 42 which does not contribute to conduction of the channel, an impurity of the second conductivity type in a higher concentration may be implanted so that the conductivity of the second conductivity type is increased, and a breakdown of the element caused by generation of potential due to charges induced by switching operation of the element is prevented.

As illustrated in FIG. 4, the peripheral region 42 and the JTE region 40 are connected to each other in the drift layer 21. In addition, as illustrated in FIG. 4, the first well region 41 and the peripheral region 42 are not directly connected to each other in the drift layer 21.

Figure 9:
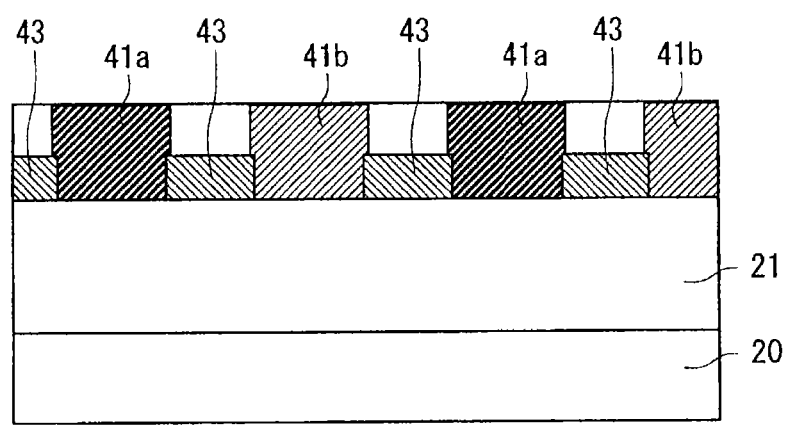
FIG. 9 is a longitudinal sectional view in the manufacturing method of the silicon carbide semiconductor device according to Embodiment 1.
Figure 10:
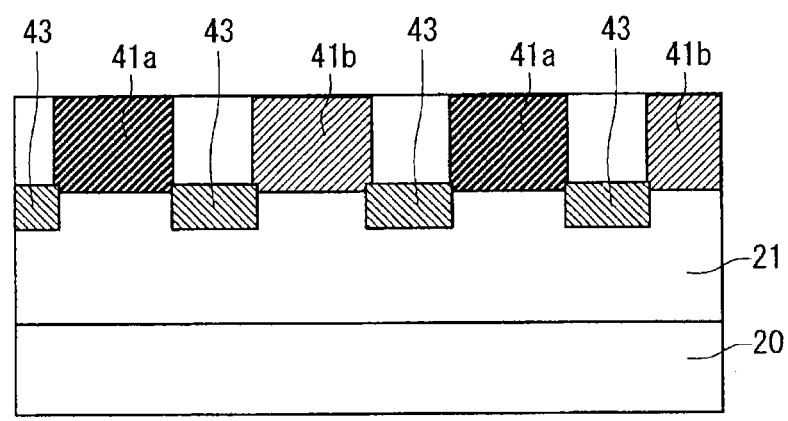
FIG. 10 is a longitudinal sectional view of a modified example in the manufacturing method of the silicon carbide semiconductor device according to Embodiment 1.

Subsequently, as illustrated in FIG. 9, an impurity is ion-implanted using a resist mask, an oxide film mask, or the like processed by photolithography to form the second well region 43 of the second conductivity type. A depth of the second well region 43 is set so that it does not go beyond the bottom surface of the drift layer 21, and is set to a value in a range between, for example, 0.3 μm and 3.0 μm. The impurity concentration of the second well region 43 exceeds the impurity concentration of the drift layer 21, and is set to a range between, for example, $1\times10^{15}$ cm$^{-3}$ and $1\times10^{21}$ cm$^{-3}$, and more preferably between $1\times10^{16}$ cm$^{-3}$ and $1\times10^{19}$ cm$^{-3}$. The impurity concentration of the second well region 43 may be different from the impurity concentration of the first well region 41. As illustrated in FIG. 9, the second well region 43 may be formed into the same depth as that of the first well region 41, or, as illustrated in FIG. 10, it may be formed deeper than the first well region 41a. However, also in FIG. 10, the first well region 41a and the second well region 43 are connected to each other at a lower portion of the first well region 41a.

Although the second well region 43 is formed in the JFET region between the first well regions 41a and 41b, the planar arrangement and structure thereof will be described later.

The second well region 43 and the first well region 41a are not formed simultaneously. In addition, the second well region 43 is formed to connect the first well region 41a and the peripheral region 42 together.

Figure 11:
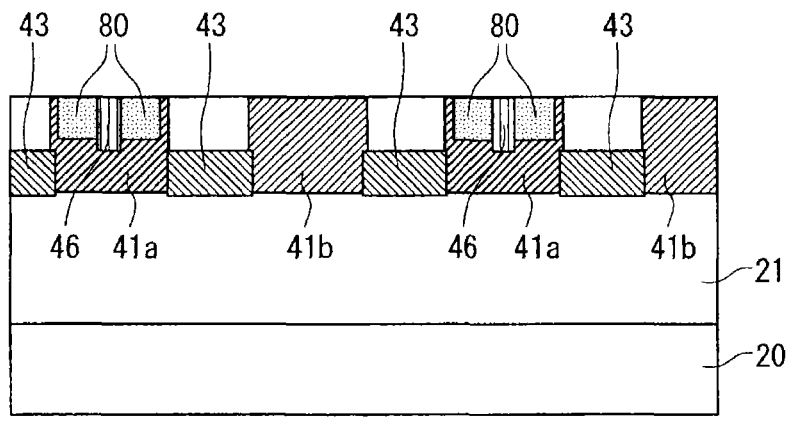
FIG. 11 is a longitudinal sectional view in the manufacturing method of the silicon carbide semiconductor device according to Embodiment 1.

Next, as illustrated in FIG. 11, an impurity is ion-implanted using a resist mask, an oxide film mask, or the like processed by photolithography, and the source region 80 of the first conductivity type and a field stopper region (not illustrated) of the first conductivity type are formed. As for a depth of the source region 80 of the first conductivity type, a bottom surface thereof is set so as not to exceed the bottom surface of the first well region 41. A value of the impurity concentration is beyond a value of the impurity concentration of the first well region 41, and is set to a value in a range between, for example, $1\times10^{17}$ cm$^{-3}$ and $1\times10^{21}$ cm$^{-3}$.

Further, to realize excellent metallic contact between the first well region 41 and the peripheral region 42, and the source pad 75, the well contact region 46 and the well contact region 47 (not illustrated) having impurity concentrations of the second conductivity type higher than the impurity concentrations of the first well region 41 and the peripheral region 42 are formed by ion implantation. It is preferable that the ion implantation be performed at a substrate temperature of 150° C. or higher. By setting such a temperature range, a layer of the second conductivity type having a low sheet resistance is formed. It is to be noted that in FIGS. 11 to 15, although the source region 80 and the well contact region 46 are also formed in the first well region 41b in a similar way as in the case of the first well region 41a, they are not illustrated to facilitate understanding.

Figure 12:
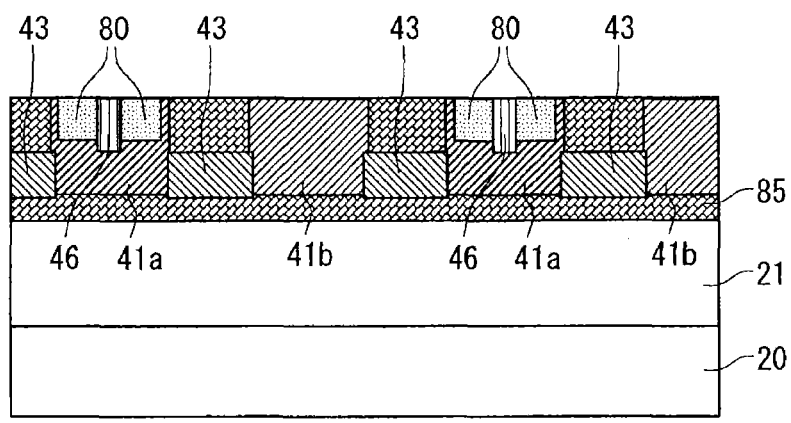
FIG. 12 is a longitudinal sectional view of a modified example in the manufacturing method of the silicon carbide semiconductor device according to Embodiment 1.
Figure 13:
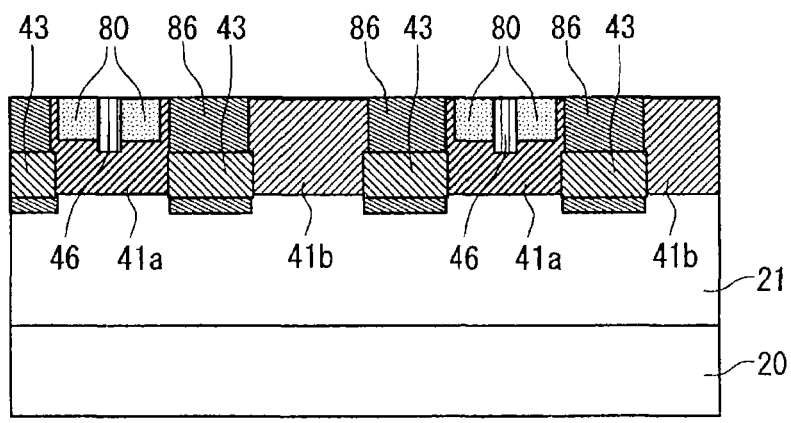
FIG. 13 is a longitudinal sectional view of a modified example in the manufacturing method of the silicon carbide semiconductor device according to Embodiment 1.

Immediately after this process, somewhere during the implantation process described previously, or at the outset of the implantation process described previously, it is also possible to ion-implant the impurity of the first conductivity type on allover the surface of the substrate as illustrated in FIG. 12 and form, on the surface of the drift layer 21 under the gate electrode 50, a high-concentration layer 85 as a second impurity region of the first conductivity type having an impurity concentration higher than the impurity concentration of the drift layer 21. As illustrated in FIG. 13, it is also possible to ion-implant an impurity of the first conductivity type into the JFET region using a resist mask, an oxide film mask, or the like processed by photolithography and form a current control layer 86 as the second impurity region of the first conductivity type. Both of these can reduce the resistance of the JFET region, and thereby reduce an ON-state resistance of this device.

The impurity concentrations of the high-concentration layer 85 and the current control layer 86 are lower than a maximum impurity concentration of the second conductivity type in the first well region 41 and lower than a maximum impurity concentration of the second conductivity type in the second well region 43, but are higher than the impurity concentration of the first conductivity type in the drift layer 21. A value thereof is set in a range between, for example, $1\times10^{16}$ cm$^{-3}$ and $1\times10^{18}$ cm$^{-3}$, and a concentration distribution in a depth direction thereof may not be uniform. Further, if the high-concentration layer 85 and the current control layer 86 are shallower than a depth of the topmost surface of the second well region 43, it presents an effect of reducing the JFET resistance. However, as illustrated in FIGS. 12 and 13, they may be formed into a depth deeper than a depth of the first well region 41. In such a case, in addition to the reduction of the JFET resistance, a spreading resistance of the JFET region is reduced, and thereby an ON-state resistance of the silicon carbide semiconductor device is reduced. Particularly, according to a structure in which the high-concentration layer 85 is formed deeper than a depth of the first well region 41 as illustrated in FIG. 12, it also provides an effect of causing an avalanche breakdown in a more stable manner between the first well region 41 and the drift layer 21 during application of a reverse bias.

The high-concentration layer 85 may be epitaxially grown on the drift layer 21 before performing the ion implantation illustrated in FIG. 6. Further, both the high-concentration layer 85 and the current control layer 86 may be formed.

Thereafter, the implanted impurity is electrically activated by performing heat treatment at a temperature ranging from 1500° C. to 2200° C. for a period ranging from 0.5 minutes to 60 minutes in an inert gas atmosphere of argon, nitrogen, or the like, or in a vacuum. During the heat treatment, the process may be performed while a surface of the drift layer 21, or a surface of the drift layer 21 and a rear surface and end surfaces of the semiconductor substrate 20 are covered by a film made of carbon. With this arrangement, it is possible to prevent surface roughness from being caused on the drift layer 21 by an etching due to residual moisture or residual oxygen inside the device during the heat treatment.

Next, after a surface altered layer is removed by forming a silicon oxide film by thermal oxidation and removing the oxide film using hydrofluoric acid to obtain a clear surface, only an active region is opened, and in a region other than this, a field oxide film 31 covered by a silicon oxide film is deposited by the CVD method or the like so that patterning is performed (not illustrated). A film thickness of the field oxide film 31 may be in a range between 0.5 μm and 2 μm.

Figure 14:
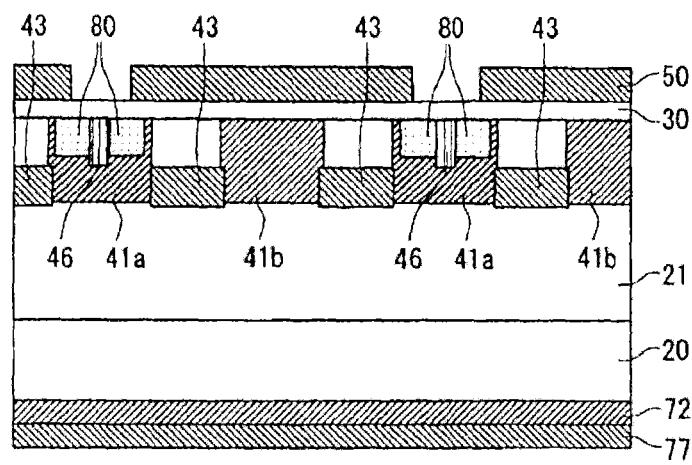
FIG. 14 is a longitudinal sectional view in the manufacturing method of the silicon carbide semiconductor device according to Embodiment 1.

Next, as illustrated in FIG. 14, for example, the gate insulating film 30 is formed by the thermal oxidation method or the deposition method, or, subsequent thereto, by the heat treatment in a nitrogen gas atmosphere such as NO or $N_2O$, or an ammonia atmosphere.

Then, polysilicon serving as a gate electrode material is deposited by the CVD method, and the gate electrode 50 is subjected to the patterning by photolithography or dry etching to thereby obtain the structure indicated in the illustration. It is preferable that polysilicon include phosphorus or boron and have a low sheet resistance. The phosphorus or boron may be taken in during film formation of polysilicon, or may be activated by ion implantation and heat treatment thereafter. Further, the gate electrode may be a multilayer film of polysilicon, metal, and an intermetallic compound.

Figure 15:
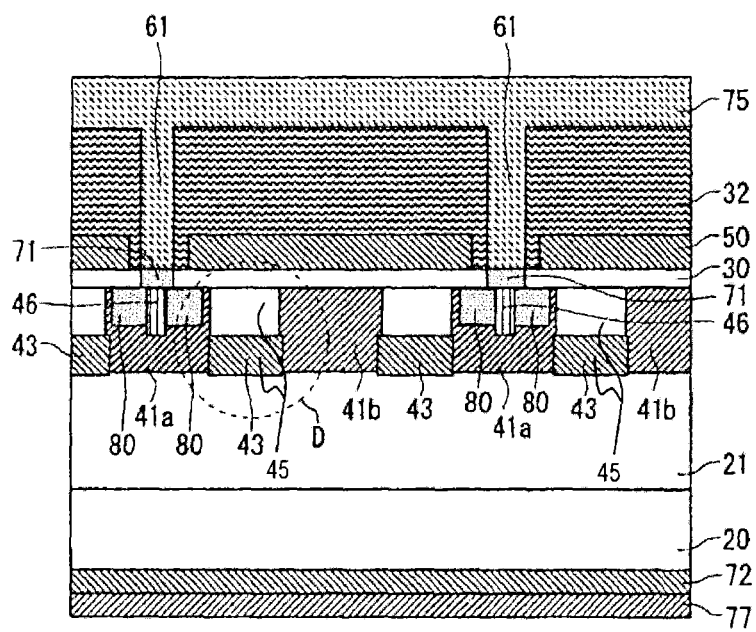
FIG. 15 is a longitudinal sectional view in the manufacturing method of the silicon carbide semiconductor device according to Embodiment 1.

Next, as illustrated in FIG. 15, after the interlayer dielectric film 32 is deposited by the CVD method or the like, the source contact hole 61 and the well contact hole 62 (not illustrated) which are supposed to be filled thereafter with the source pad 75 are formed by, for example, a dry etching method. Here, the gate contact hole 64 (not illustrated) which is supposed to be filled with the gate wiring 76 (not illustrated) may be formed at the same time. With this arrangement, the process can be simplified, and cost incurred for manufacturing the chip can be reduced.

Next, the ohmic electrode 71 is formed in a portion where silicon carbide is exposed of the source contact hole 61 and the well contact hole 62 (not illustrated) which are opened in the interlayer dielectric film 32. The ohmic electrode 71 is used for forming ohmic contact between the source region 80, and the well contact region 46 and the well contact region 47 (not illustrated). The ohmic electrode 71 can be formed by a forming method in which, after a metallic film including Ni as a main component is formed on an entire surface of the substrate, silicide is formed between the metallic film and silicon carbide by heat treatment at a temperature between 600° C. and 1100° C., the metallic film including Ni as a main component and remaining on the interlayer insulating film 32 is removed by wet etching using nitric acid, sulfuric acid, hydrochloric acid, a mixed solution thereof with a hydrogen peroxide solution, or the like.

During formation of the ohmic electrode 71, a similar metallic film is formed on a rear surface of the semiconductor substrate 20, and thereafter the ohmic electrode 72 on the rear surface may be formed by heat treatment. With this arrangement, excellent ohmic contact can be formed between the semiconductor substrate 20 made of silicon carbide and the drain electrode 77 which is formed thereafter.

The ohmic electrodes 71 may be made of an identical intermetallic compound in every portion thereof, or may be made of different intermetallic compounds individually suitable for the p-type and n-type. To state it differently, it is important that the ohmic electrode 71 has a sufficiently low ohmic contact resistance with respect to the source region 80 of the first conductivity type for reducing the ON-state resistance of the MOSFET that is to be fabricated. At the same time, a low contact resistance is also demanded with respect to the well contact region 46 of the second conductivity type and the well contact region 47 (not illustrated) for improving a forward characteristic of a body diode formed inside the MOSFET. This can be realized by patterning a metal film individually by using a photolithographic technology.

Heat treatment may be performed again after removing the metallic film including Ni as a main component and remaining on the interlayer dielectric film 32. Here, the heat treatment is performed at a temperature higher than that of the previous heat treatment so that the ohmic contact having a further lower contact resistance can be formed.

If the gate contact hole 64 (not illustrated) is formed in the previous process, a silicide layer is formed in the gate electrode 50 that is present in the bottom surface of the gate contact hole 64. If the gate contact hole 64 is not formed in the previous process, the gate contact hole 64 that is to be filled with the gate wiring 76 (not illustrated) is formed by the subsequent photolithography and etching.

Subsequently, wiring metal made of Al, Cu, Ti, Ni, Mo, W, Ta, a nitride thereof, a laminated film thereof, or an alloy thereof is formed by a sputtering method or a vapor deposition method, and patterning is performed thereafter so that the gate wiring 76, gate pad 78 (see FIG. 1), and the source pad 75 are formed. In addition, when the drain electrode 77 is formed by forming a metal film made of Ti, Ni, Ag, Au, or the like on the ohmic electrode 72 on a rear surface, the silicon carbide MOSFET illustrated in FIG. 15 is completed. In FIG. 15, the JFET region is designated by 45 and includes the second well region 43 and the portion of the drift layer 21 immediately above the second well region 43.

The cross sectional structure including the termination region in this process is illustrated in FIGS. 4 and 5. In addition, although this is not illustrated, the obverse side may be covered by a protective film such as a silicon nitride film or polyimide. These are opened in appropriate positions of the gate pad 78 and the source pad 75, and can be arranged to be connected to an external control circuit.

<A-3. Operation>

Next, operation of the silicon carbide semiconductor device fabricated according to this embodiment, and the planar arrangement of the second well region 43 will be described.

In the silicon carbide semiconductor device according to Embodiment 1, a plurality of unit cells constituting the MOSFET and a pn diode surrounding the unit cells are electrically connected to each other in parallel. The planar arrangements of the unit cells are illustrated in FIGS. 16 to 18 in addition to, for example, what is illustrated in FIG. 2. FIGS. 16 and 18 illustrate part of the vicinity of the topmost surface of the drift layer 21, FIG. 16 illustrates an arrangement in which the square cells illustrated in FIGS. 1 to 5 are alternately arranged, FIG. 17 illustrates an arrangement in which the square cells are arranged at identical interval, and FIG. 18 illustrates an arrangement in which hexagonal cells are most densely arranged.

The drift layer 21 is present in the gap of the first well region 41 and, immediately above thereof, the gate insulating film 30 and the gate electrode 50 are present (see FIG. 4).

In the meantime, it is known that the feedback capacitance between the gate electrode and the drain electrode is substantially proportional to an area of the gap region, and, as the feedback capacitance becomes larger, a loss during switching operation (switching loss) of the MOSFET becomes larger. Referring to a region encircled by D in FIG. 15, when the second well region 43 is present in a gap between the first well regions 41*a* and 41*b* as a pair, an effective area of the gap region reduces, and this provides an effect of reducing the feedback capacitance. To state it differently, this makes it possible to reduce the switching loss.

The planar arrangement of the second well region 43 will be described. In a longitudinal MOSFET having a cell structure illustrated in FIGS. 2 and 16 to 18 in the unit cell, when an OFF state in which a reverse bias is applied to the drain electrode 77 is maintained, a high electric field is induced in the gate insulating film 30 having a MOS structure and present immediately above the JFET region. In a portion where the electric field is the highest, a shield effect by a depletion layer that extends from the first well region 41 to the JFET region becomes weak, which is a location individually marked with E in FIGS. 16 to 18. To state it differently, the location is a location in plan view that includes a position where a total sum of distances among a plurality of adjacent first well regions 41 becomes the smallest.

Figure 19:
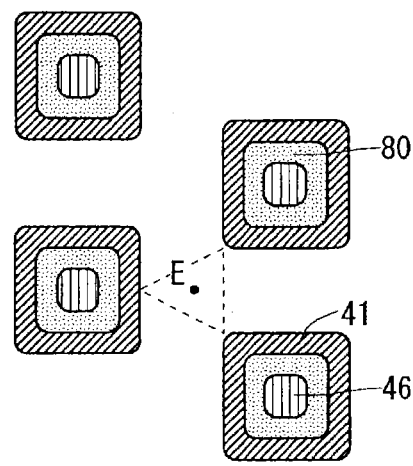
FIG. 19 is a top view of a modified example of the silicon carbide semiconductor device according to Embodiment 1.
Figure 20:
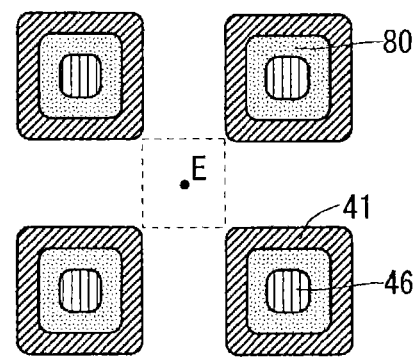
FIG. 20 is a top view of a modified example of the silicon carbide semiconductor device according to Embodiment 1.
Figure 21:
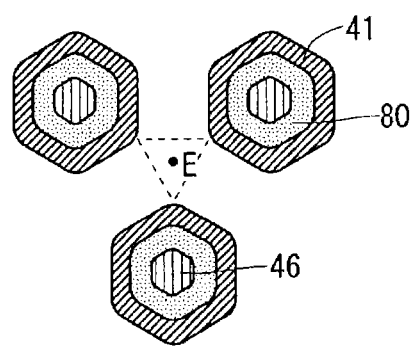
FIG. 21 is a top view of a modified example of the silicon carbide semiconductor device according to Embodiment 1.

Particularly, in an actual manufacturing process, there are many cases where pattern corners of the first well region 41 or the like are rounded as individually illustrated in FIGS. 19 to 21 depending on an accuracy of a resist pattern in the photolithographic process. As a result, the electric field strength in the location E further increases than in the cases illustrated in FIGS. 16 to 18.

Figure 30:
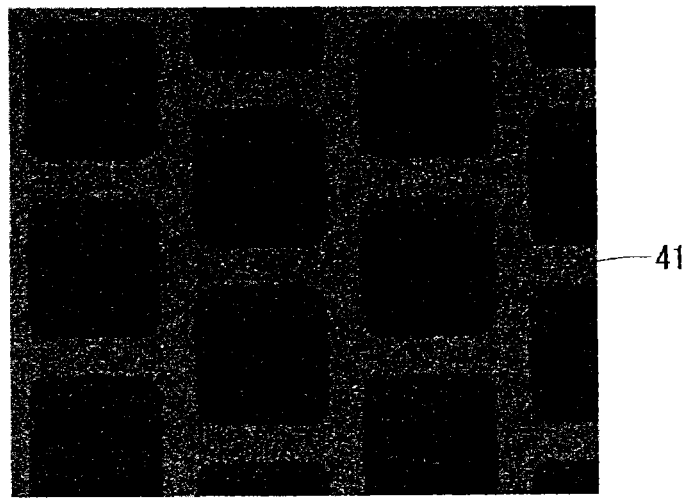
FIG. 30 is an electron microgram of an upper surface of the silicon carbide semiconductor device according to Embodiment 1.

Its aspect is illustrated in FIG. 30. FIG. 30 is an electron micrograph of a surface of the silicon carbide semiconductor immediately after the implantation of Al which forms the first well region 41. Although a chrome mask pattern (open pattern) having a square shape and sharp corners is used, a resist pattern subsequent to the photolithographic process has rounded corners of a radius of about 0.5 µm. Accordingly, it is understood that the first well region 41 reflects this and is formed to have a rounded structure.

Accordingly, covering the location E and the vicinity thereof with a layer of the second conductivity type reduces the electric field applied to the gate insulating film 30, which is preferable in view of securing the reliability of the gate insulating film 30.

FIGS. 22 to 25 illustrate planar arrangements (projected views on the surface of the substrate) of the second well region 43 which connects the first well regions 41 to one another. FIGS. 26 to 29 illustrate actual layouts correspond to these.

Figure 22:
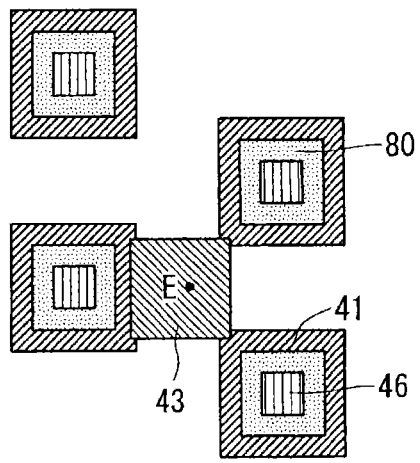
FIG. 22 is a top view of a modified example of the silicon carbide semiconductor device according to Embodiment 1.
Figure 23:
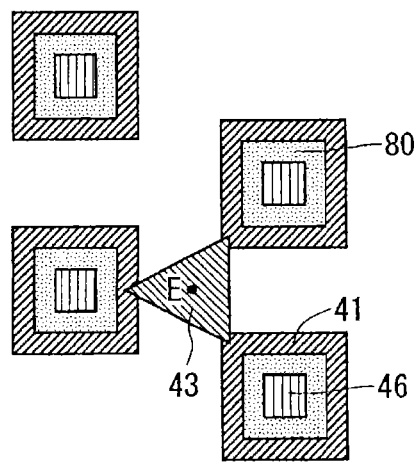
FIG. 23 is a top view of the silicon carbide semiconductor device according to Embodiment 1.

In the case where the square cells are arranged alternately as illustrated in FIGS. 22 and 23, the second well region 43 in a square shape as illustrated in FIG. 22 or in a triangular shape as illustrated in FIG. 23 includes a center of gravity E of a triangle which is formed by connecting together vertexes of two adjacent regions of the first well regions 41 and a center of the cell facing thereto. Since an area of the second well region 43 is larger in FIG. 22, the effect of reducing the feedback capacitance is larger. In contrast, since a region that shields the JFET region is smaller in FIG. 23, an increase in resistance during ON-state operation of the JFET region can be suppressed.

Figure 24:
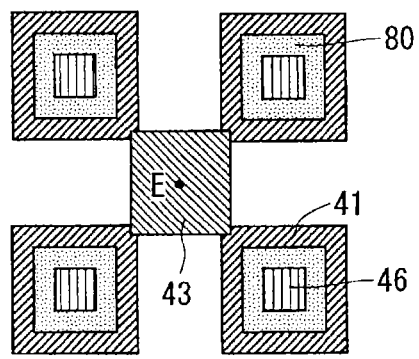
FIG. 24 is a top view of a modified example of the silicon carbide semiconductor device according to Embodiment 1.
Figure 25:
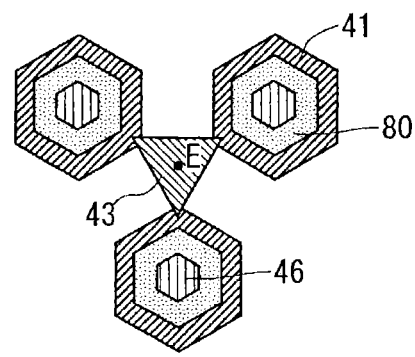
FIG. 25 is a top view of a modified example of the silicon carbide semiconductor device according to Embodiment 1.
Figure 26:
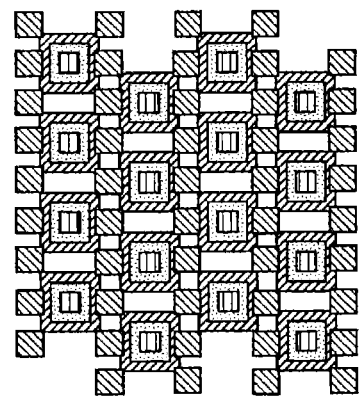
FIG. 26 is a top view of a modified example of the silicon carbide semiconductor device according to Embodiment 1.

As for the square cells in FIG. 24 and the hexagonal cells in FIG. 25, a square illustrated in FIG. 24 and a triangle illustrated in FIG. 25 include center of gravity of a square or a triangle formed by connecting together vertexes of the four or three adjacent regions of the first well regions 41, respectively.

Figure 27:
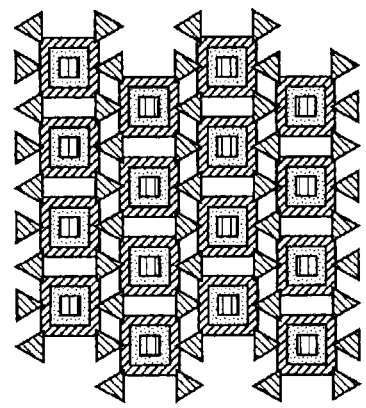
FIG. 27 is a top view of the silicon carbide semiconductor device according to Embodiment 1.
Figure 31:
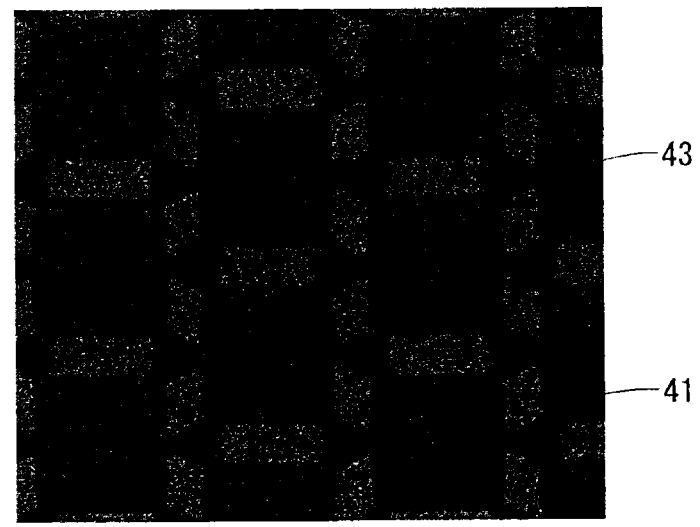
FIG. 31 is an electron microgram of an upper surface of the silicon carbide semiconductor device according to Embodiment 1.

FIG. 31 is an electron microgram of a surface of the silicon carbide semiconductor in which the structure illustrated in FIG. 27 is actually fabricated. For the rounded square first well regions 41, the second well region 43 having a triangular shape is formed among the adjacent first well regions 41, and the second well region 43 connect the first well regions 41 to one another. Arranging the second well region 43 suppresses an increase in the electric field strength in the location E (see FIG. 23) which is caused by the rounded corners of the first well regions 41, and therefore can decrease the feedback capacitance.

As a result of connecting the first well regions 41 by the second well region 43 as illustrated in FIGS. 22 to 25, the characteristic features of the present invention are found in the reduction of the feedback capacitance, the improvement of the reliability by suppressing the application of a high electric field to the gate insulating film 30, further, the increase in the forward current of a body diode due to an increase in the joint area thereof, and the like. In addition, as illustrated in FIGS. 4, 5, and 15, since the second well region 43 is absent in the topmost surface of the drift layer 21, it is possible to reduce the feedback capacitance without causing a large increase of the ON-state resistance.

If the second well region 43 illustrated in FIGS. 22 to 25 extends as far as to the topmost surface of the drift layer 21, part of a channel formed on the surface due to the first well region 41, the source region 80, and the JFET region is choked by a second conductivity type region. As a result, a channel width per unit cell area is reduced, and the ON-state resistance is increased because this deprives the JFET region of a region for generating carriers that are induced by the gate electric field during the ON-state operation.

According to the present invention, the second well region 43 is absent on the surface of the drift layer 21, such a problem is not caused, and therefore the present invention has a feature of reducing the feedback capacitance without causing a large increase in the ON-state resistance.

Figure 32:
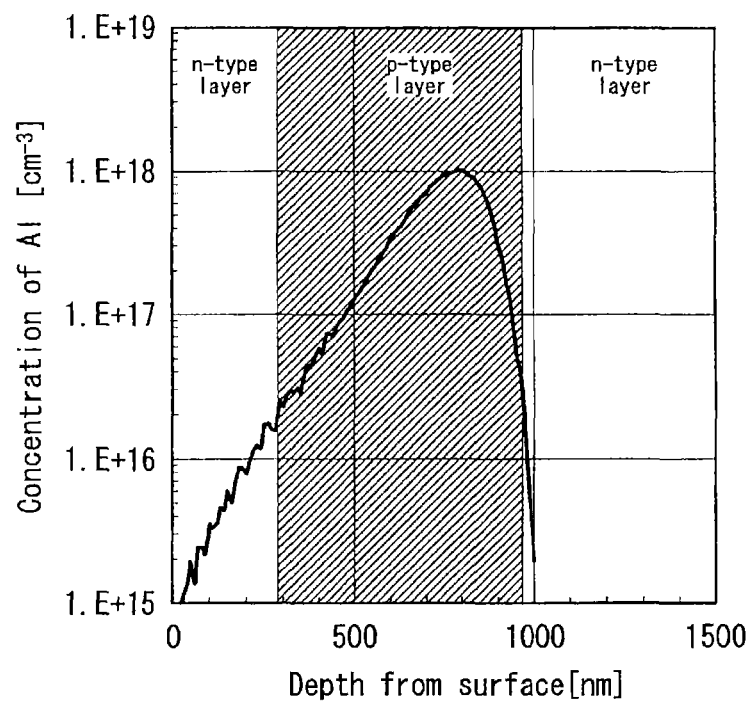
FIG. 32 is a diagram indicating an impurity concentration distribution of the silicon carbide semiconductor device manufactured according to Embodiment 1.

As indicated in the result of the numerical calculation in FIG. 32, it is possible to fabricate the structure of the second well region 43 in which an n-type layer of the JFET region is provided by, for example, implanting Al at 700 keV in the drift layer 21 made of silicon carbide, a p-type layer is provided up to a depth of about 0.3 µm to 1.0 µm, and an n-type layer is further provided on a side deeper than 1.0 µm. Here, a vertical axis in the illustration represents a concentration of Al, and a horizontal axis represents a depth (nm) from the surface. The p-type layer is formed so that the second well region 43 does not extend up to the topmost surface of the drift layer 21. According to this calculation, the impurity concentration of the drift layer is set to $2 \times 10^{16}$ $cm^{-3}$. Particularly, since the thermal diffusion of the impurity in silicon carbide is smaller as compared with the thermal diffusion in conventional silicon, a distribution during the implantation is substantially maintained even if an activation heat treatment at a high temperature is performed, and smoothing of the impurity concentration by the thermal diffusion is suppressed, it is possible to easily fabricate the structure of the second well region 43 as illustrated in FIGS. 1 to 5 and FIGS. 6 to 15.

<A-4. Effect>

According to Embodiment 1 of the present invention, a semiconductor device includes: a semiconductor substrate 20 of the first conductivity type; a drift layer 21 of the first conductivity type formed on a surface of the semiconductor substrate 20; a plurality of first well regions 41 of a second conductivity type formed selectively on a surface of the drift layer 21; a source region 80 of the first conductivity type which is an area formed selectively on a surface of each of the first well regions 41 and defining, as a channel region, the surface of each of the first well regions 41 interposed between the area and the drift layer 21; a gate electrode 50 formed over the channel region and the drift layer 21 thereacross through a gate insulating film 30; a plurality of second well regions 43 of the second conductivity type which are buried inside the drift layer 21 below the gate electrode 50, and formed to be individually connected to each of the first well regions 41 adjacent to one another, and partially connects a region among the plurality of first well regions 41 in plan view; a source electrode connected to the source region 80 and formed to be directly connected to only the first well regions 41 between the first and second well regions 41 and 43; and a drain electrode 77 formed on a rear surface of the semiconductor substrate 20. Accordingly, the second well regions 43 are formed in positions that do not serve as a channel region, and it is possible to reduce the feedback capacitance without causing increases in the channel resistance and JFET resistance due to a reduction in a channel width, and thereby to reduce the ON-state loss and switching loss of the semiconductor device.

According to Embodiment 1 of the present invention, since the distribution of the impurity concentration of the second conductivity type is different between the first well region 41 and the second well region 43 in the semiconductor device, it is possible to reduce the feedback capacitance without affecting the channel characteristic.

According to Embodiment 1 of the present invention, the second well region 43 is formed to include a position in plan view at which a total sum of distances between the second well region 43 and the plurality of first well regions 41 to which the second well region 43 is connected becomes a minimum. Accordingly, application of a high electric field to the gate insulating film 30 is suppressed during application of a reverse bias, so that the reliability of the gate insulating film 30 is improved.

According to Embodiment 1 of the present invention, in the surface of the drift layer 21 under the gate layer 50, the semiconductor device further includes a high-concentration layer 85 and a current control layer 86 which are second impurity regions of the first conductivity type and have impurity concentrations higher than the impurity concentration of the drift layer 21, and therefore it is possible to reduce the resistance of the JFET region.

According to Embodiment 1 of the present invention, the semiconductor substrate 20 is formed of a wide bandgap semiconductor in the semiconductor device. Accordingly, since the withstand voltage is improved, and the allowed current density is increased, so that miniaturization of the semiconductor device can be achieved. In addition, since the power loss is reduced, it is possible to make the semiconductor device highly efficient.

B. Embodiment 2

<B-1. Structure>

Figure 33:
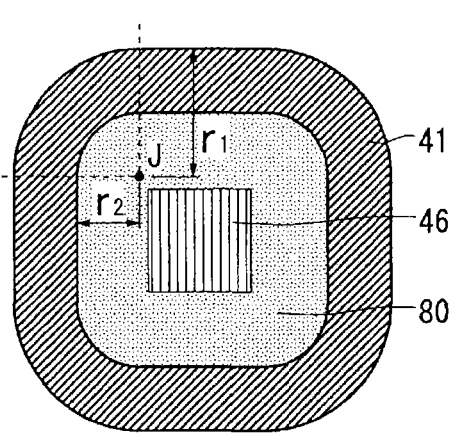
FIG. 33 is a top view of a silicon carbide semiconductor device according to Embodiment 2.
Figure 34:
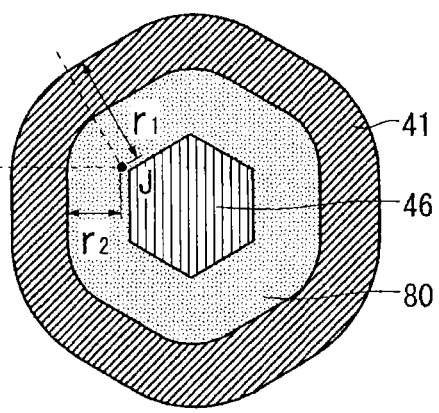
FIG. 34 is a top view of a modified example of the silicon carbide semiconductor device according to Embodiment 2.
Figure 35:
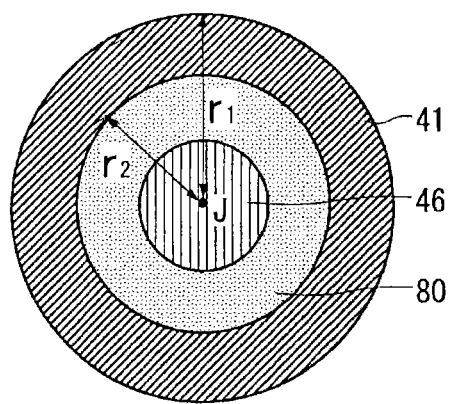
FIG. 35 is a top view of a modified example of the silicon carbide semiconductor device according to Embodiment 2.
Figure 36:
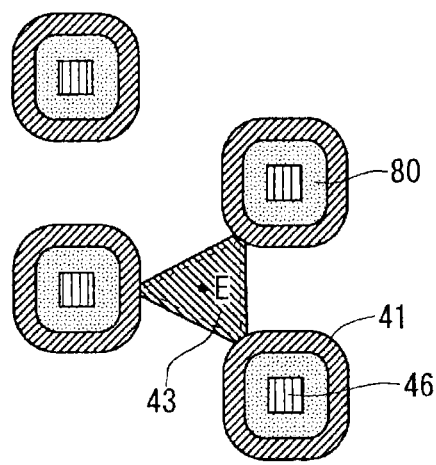
FIG. 36 is a top view of the silicon carbide semiconductor device according to Embodiment 2.
Figure 37:
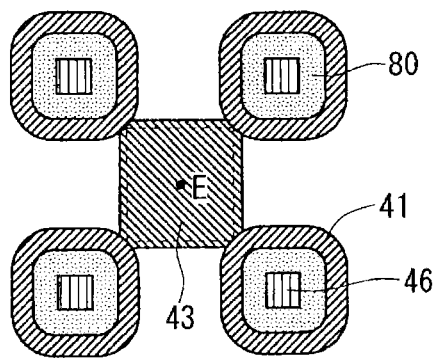
FIG. 37 is a top view of a modified example of the silicon carbide semiconductor device according to Embodiment 2.
Figure 38:
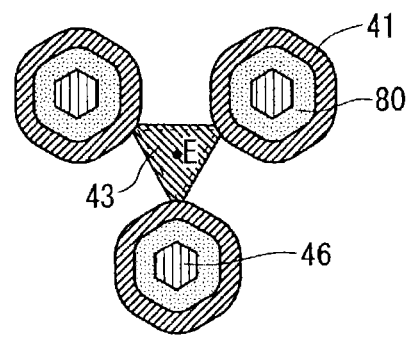
FIG. 38 is a top view of a modified example of the silicon carbide semiconductor device according to Embodiment 2.
Figure 39:
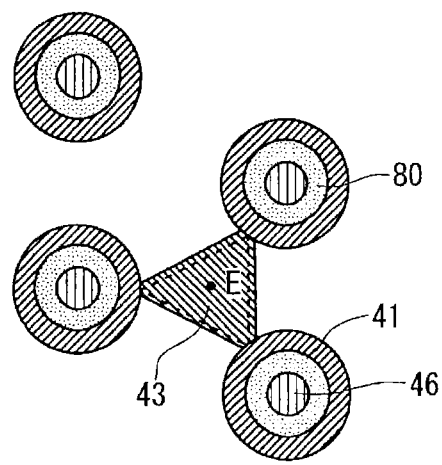
FIG. 39 is a top view of a modified example of the silicon carbide semiconductor device according to Embodiment 2.
Figure 40:
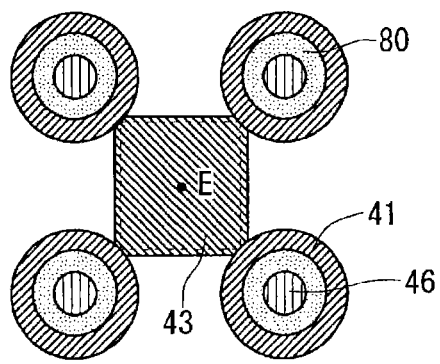
FIG. 40 is a top view of a modified example of the silicon carbide semiconductor device according to Embodiment 2.

FIGS. 33 to 35 are diagrams illustrating a silicon carbide semiconductor device according to Embodiment 2, and more particularly unit cells of a silicon carbide MOSFET. FIGS. 36 to 40 are diagrams illustrating the silicon carbide semiconductor device according to Embodiment 2, and more particularly diagrams (projected views on the surface of the substrate) of a planar arrangement of the unit cells and second well regions 43 of the silicon carbide MOSFET.

In Embodiment 2, channel lengths on a surface of a drift layer 21 defined by a gap between a first well region 41 and a source region 80 are identical with one another throughout in the unit cell.

Specifically, at corners of a square unit cell illustrated in FIG. 33, the first well region 41 and the source region 80 are formed by circular arc patterns (radius r1 and radius r2) of 90 degrees with a location J as a center thereof, respectively.

Further, at corners of a hexagonal unit cell illustrated in FIG. 34, the first well region 41 and the source region 80 are formed by circular arc patterns (radius r1 and radius r2) of 60 degrees with the location J as a center thereof, respectively.

Furthermore, in a circular unit cell illustrated in FIG. 35, the first well region 41 and the source region 80 are formed by circular arc patterns (radius r1 and radius r2) with the location J as a center of the unit cell, respectively.

<B-2. Operation>

By forming such first well region 41 and source region 80, the channel lengths in the unit cell are uniformalized. In the conventional case, for example, at the corners of the square unit cell illustrated in FIG. 16, a gap between the first well region 41 and the source region 80 is 1.41 times longer at maximum than a position other than the corners, and a channel resistance in this portion is higher. Further, in the vicinity of the vertex at the corner, current concentration is caused because distances from two sides (two directions) that form the corner are minimized. Specifically, at the corner, a distribution of the ON-state current is uneven, which presents a problem in view of the reliability of the element. In the structure of the unit cell according to this embodiment, the channel lengths are constant throughout in the unit cell, therefore, excessive current concentration is not caused, and this provides an effect of improving the reliability of the element.

As a method to form such first well regions 41 and source region 80, ion implantation of the impurity using individual masks may be performed. However, after the implantation process of the well using a mask of the first well region 41, the mask may be thickened by an amount of the channel length and used as the source implantation mask, or, after the implantation process of the source using a mask of the source region 80, the mask may be thinned by an amount of the channel length and used as the well implantation mask. For example, after the implantation process, oxidation treatment is applied to the well implantation mask using polycrystal silicon to form a thermally oxidized film around the polycrystal silicon and use it as a composite mask for performing the source implantation so that a channel length corresponding to an increase in volume can be realized. In addition, after the implantation process, isotropic etching of an oxide film or a resist and then the well implantation are applied to the source implantation mask that uses a silicon oxide film or a photoresist after the source implantation, so that a channel length corresponding to a decrease in volume can be realized.

Such a self-aligned method for determining the channel length provides a more effect in realizing a constant channel length in the structure of the circular unit cell illustrated in FIG. 35 which is excellent in symmetry with respect to a center of the unit cell. This is because, in the case where a structural modification of the implantation mask is performed by a chemical method such as oxidation or etching, since different reaction rates are frequently caused between the corner portion and the linear portion, an increase in volume or a decrease in volume is not necessarily caused in all direction and for the same amount of length, which results in unbalance in the channel length.

If curvature radiuses of the corners of the square and the hexagon individually illustrated in FIGS. 33 and 34 are 0.5 µm or larger in the source region 80 which is smaller than the first well region 41, they can be sufficiently resolved by the conventional photolithographic technique. Further, if the curvature radius is made too large, a reduction in channel width becomes large as compared with the original channel widths of the square shape and the hexagonal shape, which, as a result, increases the channel resistance. Therefore, the curvature radius of the source region 80 of about 2.0 µm may serve well.

In the mean time, in order to make the channel length constant, it is also conceivable to provide a structure of the unit cell in which the corners of the square source region 80 are maintained at 90 degrees, or the corners of the hexagonal shape of the source region are maintained at 120 degrees without providing rounded corners, but only the corners of the first well region 41 are rounded. However, as indicated in Embodiment 1, it is not easy to fabricate such an acute-angle pattern as the implantation mask, and it is often the case that the corners are rounded as illustrated in FIG. 30, which does not result in a constant channel length. Even if an implantation mask of an acute-angle pattern can be formed, the ON-state current concentrates on the corners of the source region 80, which is unfavorable in view of the reliability.

In the structure of the unit cell having the rounded corners such as those of the first well region 41 illustrated in FIGS. 33 to 35, the gap (JFET length) in the first well region partially increases as compared with the structure without rounded corners, and there is a concern that the electric field increases over the JFET opening region as illustrated in FIGS. 36 to 40. Here, arranging the second well region 43 as indicated in the present invention provides an effect of suppressing application of the high electric field and degradation in the reliability of the gate oxide film. According to this structure, it is needless to say that the feedback capacitance is decreased, and the joint area of the body diode increases so that the forward current of the body diode can be increased.

<B-3. Effect>

According to Embodiment 2 of the present invention, since gaps between the first well region 41 and the source region 80 are identical with one another throughout on the surface of the drift layer 21 in the semiconductor device, a distribution of the ON-state current in the channel region during the ON-state operation is uniformalized, and therefore the reliability of the element is improved.

Further, according to Embodiment 2 of the present invention, since symmetry is excellent with respect to a center of the unit cell in the case the first well region 41 is circular in the semiconductor device, a constant channel length can be realized by forming the mask using a self-aligned method.

C. Embodiment 3

<C-1. Structure>

Figure 43:
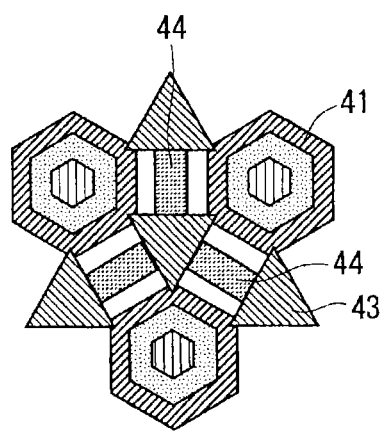
FIG. 43 is a top view of a modified example of the silicon carbide semiconductor device according to Embodiment 3.

FIGS. 41 to 43 are diagrams illustrating a silicon carbide semiconductor device according to Embodiment 3, and more particularly diagrams (projected views on the surface of the substrate) of a planar arrangement of the unit cells of the silicon carbide MOSFET.

According to Embodiment 3, there are further provided third well regions 44 buried inside the drift layer 21 between a plurality of isolated second well regions 43 and formed to be individually connected to each of the second well regions 43 that are adjacent to one another.

Here, the third well regions 44 are present in the JFET region or therebelow, but are absent on a surface of the drift layer 21. Further, the third well regions 44 are present at a same depth as the second well regions 43 or deeper than the second well regions 43.

This means that the third well regions 44 are not directly connected to first well regions 41. In addition, the third well regions 44 are not directly connected to a peripheral region 42.

<C-2. Operation>

By forming such third well regions 44, it is possible to reduce the switching loss due to a further reduction of the feedback capacitance. Further, since the joint area of the body diode is further increased, so that a forward current thereof can increase.

Figure 44:
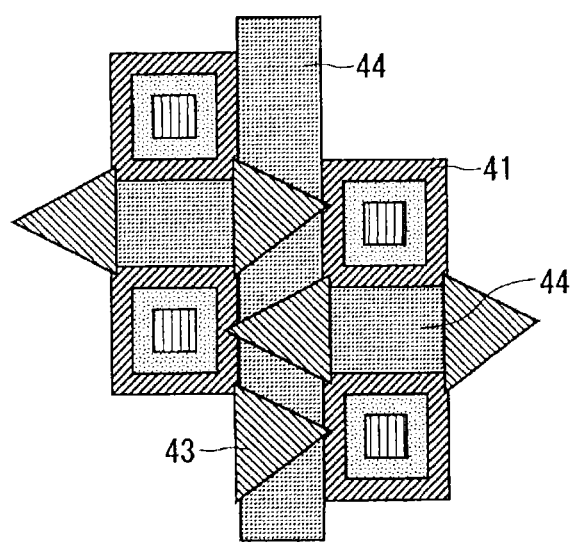
FIG. 44 is a top view of the silicon carbide semiconductor device according to Embodiment 3.

By providing a structure in which the second well region 43 makes contact with the first well region 41 in the vicinity of a bottom surface thereof, and the third well region 44 makes contact with the second well region 43 in the vicinity of the bottom surface of the second well region 43, narrowing of a JFET region caused by inserting the third well region 44 is alleviated. This means that a significant increase of the JFET resistance can be prevented since the gaps of the first well region 41 and the third well region 44 spread deep inside the substrate. In addition, FIGS. 44 to 46 illustrate arrangements of the third well regions 44 viewed on a projection onto the surface of the substrate, and making such arrangements, i.e., a structure in which the JFET region is all buried with the third well regions 44, is effective in further reducing the feedback capacitance.

Figure 45:
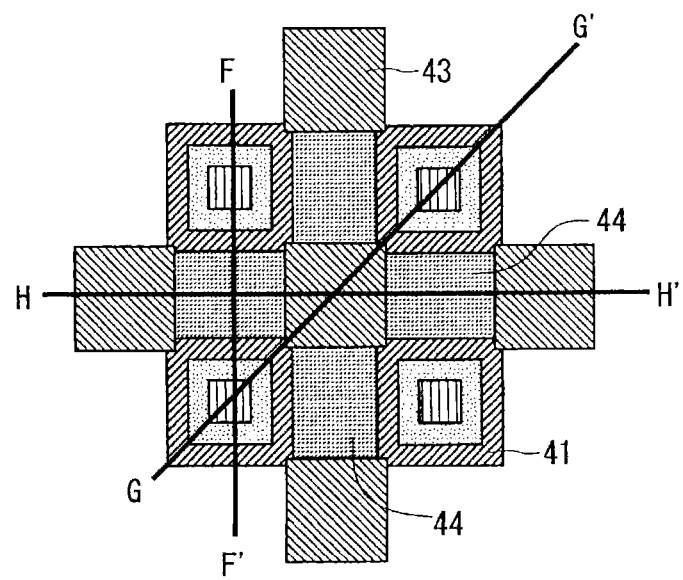
FIG. 45 is a top view of a modified example of the silicon carbide semiconductor device according to Embodiment 3.
Figure 46:
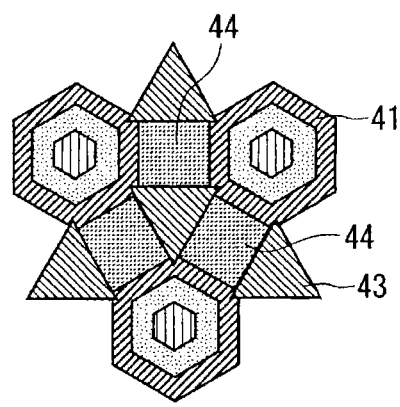
FIG. 46 is a top view of a modified example of the silicon carbide semiconductor device according to Embodiment 3.
Figure 47:
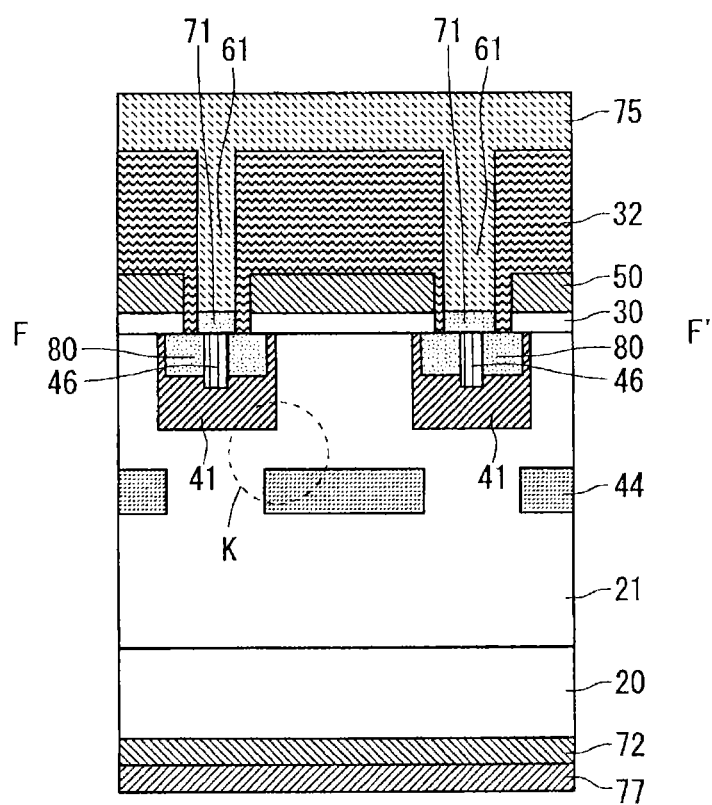
FIG. 47 is a longitudinal sectional view in a manufacturing method of the silicon carbide semiconductor device according to Embodiment 3.
Figure 48:
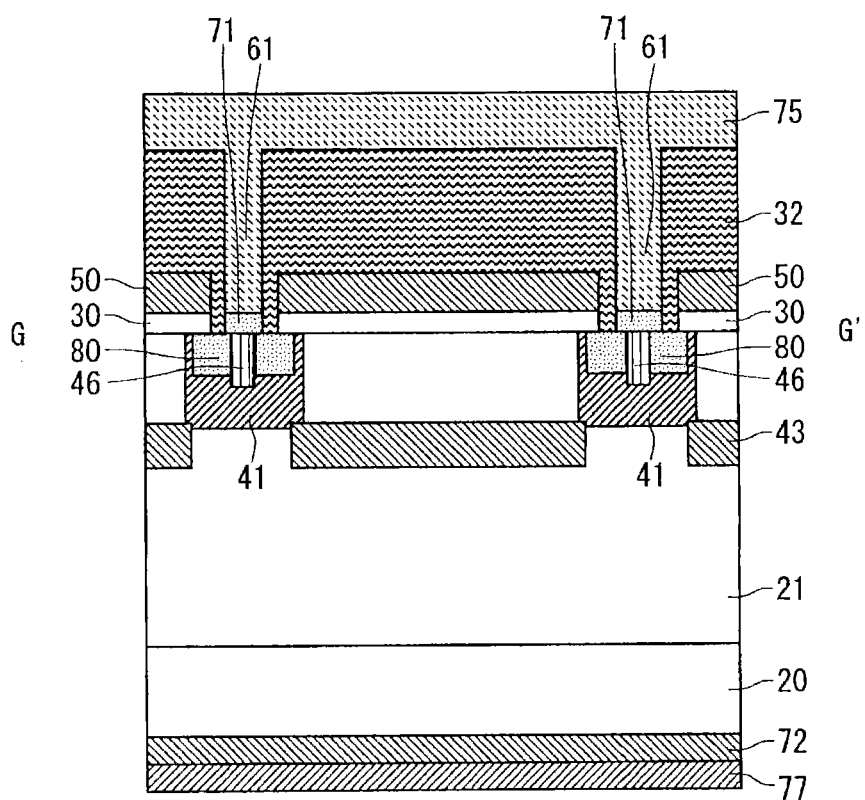
FIG. 48 is a longitudinal sectional view in a manufacturing method of the silicon carbide semiconductor device according to Embodiment 3.
Figure 49:
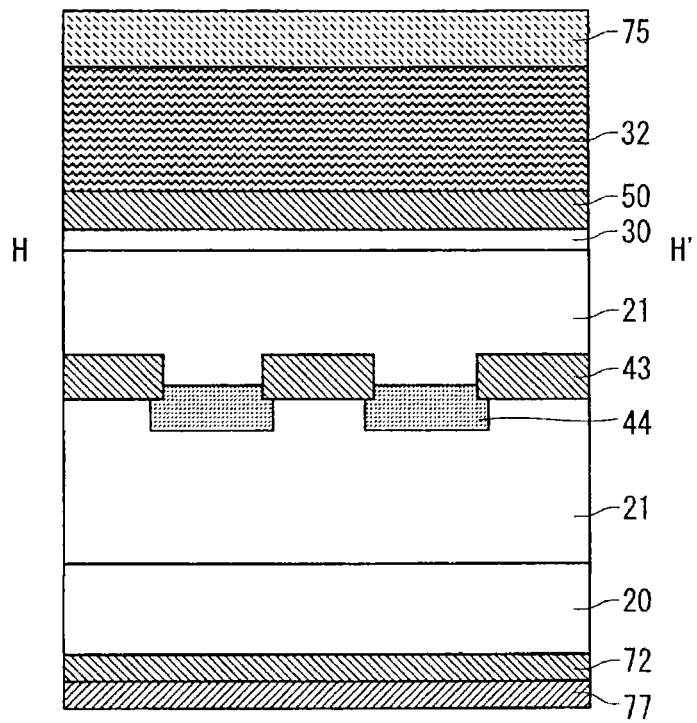
FIG. 49 is a longitudinal sectional view in a manufacturing method of the silicon carbide semiconductor device according to Embodiment 3.

A detail of the planar structure in FIG. 45 is illustrated in FIGS. 47 to 49. FIGS. 47 to 49 illustrate cross sectional structures taken along a line F-F', a line G-G', and a line H-H' in FIG. 45, respectively. Specifically, the second well region 43 is connected to the first well region 41 therebelow as illustrated in FIG. 48. The third well region 44 is connected to the second well region 43 therebelow as illustrated in FIG. 49. As illustrated in FIG. 47, a projection plane of the JFET opening region is covered by the third well region 44 located therebelow. However, as indicated by a mark K in FIG. 47, this can be also arranged by providing a gap between the first well region 41 and the third well region 44. With this arrangement, the ON-state current flows through the gap, and therefore a significant reduction of the feedback capacitance can be achieved without causing a problem in which the element fails to turn on. Further, this sterically widens the opening region of the JFET region, and, as a result, the ON-state resistance can be reduced. Since the structures illustrated in FIGS. 47 to 49 are similar to the structure indicated in Embodiment 1 except for the presence of the third well regions 44, the detailed description of the other structures will be omitted.

<C-3. Effect>

According to Embodiment 3 of the present invention, there are provided a plurality of second well regions 43, and there are further provided the third well regions 44 of the second conductivity type that are buried inside the drift layer 21 among a plurality of the first well regions 41 and formed to be individually connected to the adjacent each of second well regions 43. Accordingly, it is possible to reduce the feedback capacitance and the switching loss, and increase the ON-state current of the body diode.

In addition, according to Embodiment 3 of the present invention, since an upper surface of the third well region 44 is formed below a lower surface of the first well region 41 in the semiconductor device, this makes it possible to sterically widen the opening region of the JFET region so that the ON-state resistance can be reduced.

Further, according to Embodiment 3, since the second well regions 43 and the third well regions 44 are formed to cover all the regions among the plurality of first well regions 41 in plan view in the semiconductor device, it is possible to further decrease the feedback capacitance.

D. Embodiment 4

<D-1. Structure>

Figure 50:
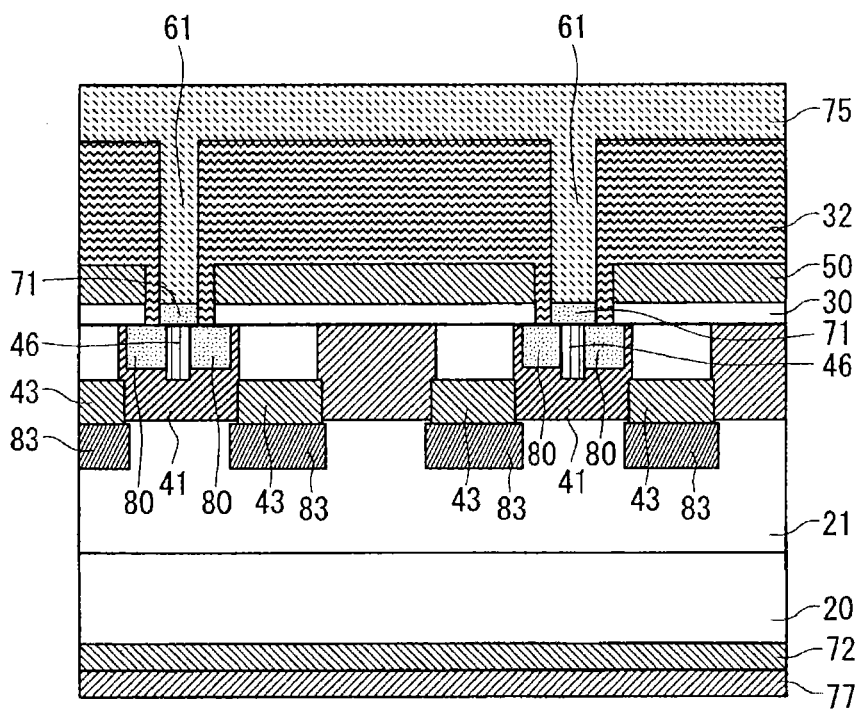
FIG. 50 is a longitudinal sectional view in a manufacturing method of a silicon carbide semiconductor device according to Embodiment 4.

FIG. 50 is a diagram illustrating a cross sectional structure of a silicon carbide semiconductor device according to Embodiment 4, and particularly unit cells of a silicon carbide MOSFET.

Embodiment 4 is characterized in that, when the second wells 43 are formed by implanting an impurity, an implantation mask used in this process is used, as is, to continuously implant an impurity of the first conductivity type to form a current spreading layer 83 as a first impurity region of the first conductivity type. The current spreading layer 83 has an impurity concentration higher than that of the drift layer 21, specifically, in the range between, for example, $2 \times 10^{13}$ cm$^{-3}$ and $2 \times 10^{18}$ cm$^{-3}$, and a depth thereof does not exceeds that of the drift layer 21 but is merely 1 μm. Since the structure illustrated in FIG. 50 is similar to the structure indicated in Embodiment 1 except that the current spreading layer 83 is provided, the detailed description of the other structures will be omitted.

<D-2. Operation>

By providing the current spreading layer 83 by a self-aligned method using the same mask as used in forming the second well regions 43, the current that has passed through the JFET region during the ON-state operation tends to spread in a transverse direction in which the current spreading layer 83 having a low resistance is present. Therefore, it is possible to reduce the JFET spreading resistance. Particularly, by forming the current spreading layer 83 by implanting an impurity of the first conductivity type, it is possible to form an area more spreading transversely than the second well region 43 even by using the same implantation mask due to an effect of transverse spreading during implantation. Therefore, the effect of reducing the JFET resistance becomes more remarkable.

The current spreading layer 83 may be formed in a manner to spread more transversely by implanting the impurity at an angle slightly inclined from a vertical direction toward a horizontal direction (oblique implantation) with respect to surface of the substrate when the impurity of the first conductivity type is implanted.

As indicated in the result of the numerical calculation in FIG. 51, such a spreading structure of the current spreading layer 83 is formed into a longitudinal structure with the second well region 43 having a depth of about 0.3 μm to 1.0 μm and the current spreading layer 83 formed from there up to a depth of about 1.3 μm by forming, in the drift layer 21 made of silicon carbide, a p-type layer formed by, for example, implanting aluminum at 700 keV and an n+ type layer formed by, implanting nitrogen at 1.3 MeV. Here, a vertical axis in the illustration represents a concentration of Al or N, and a horizontal axis represents a depth (nm) from the surface. Particularly, since the thermal diffusion of the impurity in silicon carbide is smaller as compared with the thermal diffusion in conventional silicon, a distribution during the implantation is substantially maintained even if an activation heat treatment at a high temperature is performed, and smoothing of the impurity concentration by the thermal diffusion is suppressed, it is possible to easily fabricate the structure illustrated in FIG. 51.

A similar effect can be provided even if the current spreading layer 83 of the first conductivity type is formed below the third well region 44 by using a similar self-aligned method when the third well region 44 is formed as indicated in Embodiment 3.

<D-3. Effect>

According to Embodiment 4 of the present invention, by further providing the current spreading layer 83 which is formed below the second well region 43 and/or the third well region 44, has an impurity concentration higher than the impurity concentration of the drift layer 21, and is a first impurity region of the first conductivity type in the semiconductor device, it is possible to reduce the spreading resistance in the JFET region.

The foregoing effects indicated in Embodiments 1, 2, 3, and 4 are not affected by the manufacturing method for forming the structures. Accordingly, the effects thus described are not affected even if this device is fabricated by the manufacturing methods other than those described, as examples, in Embodiments 1, 2, 3, and 4.

Although the embodiments of the present invention have been disclosed and described in detail, what are described are examples of aspects to which the present invention can be applied, and therefore the present invention is not limited to such examples. Accordingly, it is also possible to conceive various modifications and variations for the aspects thus described without departing from the scope of the present invention.

Further, in the present invention, the case where the semiconductor element is a longitudinal MOSFET is disclosed. However, even if a semiconductor element having a cell region of IGBT is formed by providing a collector layer of the second conductivity type between, for example, the semiconductor substrate 20 illustrated in FIG. 4 and the ohmic electrode 72 on the reverse side thereof, the effect of the present invention thus described can also be provided. Accordingly, it can be said that the range that can be covered by the effect of the present invention is a semiconductor element as a switching element including a MOS structure such as a MOSFET or an IGBT.

Further, in the present invention, the semiconductor element itself having a MOS structure described in Embodiments 1, 2, 3, and 4 is defined as a "semiconductor device" in a narrow sense. In addition, a power module itself incorporated with this semiconductor element as an application such as an inverter module, which is mounted in a lead frame an sealed together with a free wheel diode connected in an inverse-parallel connection manner to the semiconductor element and a control circuit and the like which generate and apply a gate voltage of the semiconductor element, is also defined as the "semiconductor device" in a broader sense.

While the present invention has been shown and described in detail, the foregoing description is in all aspects illustrative and not restrictive. It is therefore understood that numerous variations can be devised without departing from the scope of the present invention.

INDUSTRIAL APPLICABILITY

The present invention is suitable for application to a power converter such as an inverter.

EXPLANATION OF REFERENCE NUMERALS 20, semiconductor substrate; 21, drift layer; 30, gate insulating film; 31, field oxide film; 32, interlayer dielectric film; 40, JTE region; 41, 41a, 41b, first well region; 42, peripheral region; 43, second well region; 44, third well region; 46, 47, well contact region; 50, gate electrode; 61, source contact hole; 62, well contact hole; 64, gate contact hole; 71, 72, ohmic electrode; 75, source pad; 76, gate wiring; 77, drain electrode; 78, gate pad; 80, source region; 83, current spreading layer; 85, high-concentration layer; 86, current control layer.

The invention claimed is:

1. A semiconductor device comprising:
   a semiconductor substrate of a first conductivity type;
   a semiconductor layer on a surface of said semiconductor substrate;
   a source electrode on a surface of said semiconductor layer;
   a drain electrode on a rear surface of said semiconductor substrate; and
   a gate electrode forming a channel region in said semiconductor layer;
   wherein said semiconductor layer comprises:
      a first conductivity region on said surface of said semiconductor substrate;
      a plurality of first well regions of a second conductivity type on said first conductivity region, facing said gate electrode with an insulating film therebetween;
      a source region of the first conductivity type in a surface region of each of said first well regions, connected to said source electrode; and
      a second well region of the second conductivity type in said semiconductor layer which is vertically overlapped by the gate electrode, the second well region of the second conductivity type in said semiconductor layer overlapping the drain electrode,
   wherein a second conductivity type impurity concentration profile of said second well region includes a maximum value point, which is at a position which is not vertically overlapped by the first well region, which is deeper than a surface of said second well region between said gate electrode and said drain electrode, and
   wherein a second conductivity type impurity concentration of the maximum value point is at least ten times greater than a second conductivity type impurity concentration of the surface of said second well region.

2. The semiconductor device according to claim 1, wherein said maximum value point is located at a depth of 0.3 μm to 1.0 μm from the surface of said semiconductor layer.

3. The semiconductor device according to claim 1, wherein said maximum value point is located deeper than said surface of said semiconductor layer.

4. The semiconductor device according to claim 3, wherein said maximum value point is located at a depth less than 0.7 μm from the surface of said semiconductor layer.

5. The semiconductor device according to claim 1, wherein the second impurity type concentration of said second well region is in a range between $1 \times 10^{15}$ cm$^{-3}$ and $1 \times 10^{21}$ cm$^{-3}$.

6. The semiconductor device according to claim 5, wherein the second impurity type concentration of said second well region is in a range between $1 \times 10^{16}$ cm$^{-3}$ and $1 \times 10^{19}$ cm$^{-3}$.

7. The semiconductor device according to claim 1, wherein said second well region is formed to include a position in plan view at which a total sum of distances between said second well region and said plurality of first well regions becomes a minimum.

8. The semiconductor device according to claim 1, wherein said second well region is formed at a position deeper than the position of said first well regions.

9. The semiconductor device according to claim 8, wherein said second well region is connected to said first well regions there below.

10. The semiconductor device according to claim 1, wherein a depth of said first well regions is substantially the same as a depth of said second well region.

11. The semiconductor device according to claim 1, wherein said first well regions and said second well region are different from each other in a distribution of an impurity concentration of the second conductivity type in the depth direction from the surface of said semiconductor layer.

12. The semiconductor device according to claim 1, further comprising on said first conductivity region, a high-concentration region higher than said first conductivity region in a first conductivity type impurity concentration.

13. The semiconductor device according to claim 12, wherein said first conductivity type impurity concentration of said high-concentration region is in a range between $1\times10^{16}$ cm$^{-3}$ and $1\times10^{18}$ cm$^{-3}$.

14. The semiconductor device according to claim 12, wherein said high-concentration region is formed deeper than said first well regions.

15. The semiconductor device according to claim 1, further comprising
a peripheral region of the second conductivity type in said first conductivity region around a cell region including said plurality of first well regions.

16. The semiconductor device according to claim 15, wherein an impurity concentration of the second conductivity type of said first well regions is substantially the same as an impurity concentration of the second conductivity type of said peripheral region.

17. The semiconductor device according to claim 15, wherein a depth of said first well regions is substantially the same as a depth of said peripheral region.

18. The semiconductor device according to claim 1, wherein said semiconductor substrate is formed of a wide bandgap semiconductor.

19. The semiconductor device according to claim 18, wherein said wide bandgap semiconductor is a silicon carbide.

20. The semiconductor device according to claim 1, wherein said second well region is connected to at least one of said first well regions.

21. The semiconductor device according to claim 1, further comprising:
an interlayer insulating film electrically isolating said source electrode and said gate electrode and having a source contact hole,
wherein said source electrode is electrically connected to both of said source region and a second conductivity type region in said first well region via said single source contact hole.

22. The semiconductor device according to claim 1, wherein:
said second well region includes a plurality of maximum value points, which do not vertically overlap the first well region, which are deeper than said surface of said semiconductor layer between said gate electrode and said drain electrode, and said plurality of maximum value points extend from one side of said second well region to another side of said second well region in a horizontal direction.

23. The semiconductor device according to claim 1, wherein:
the second conductivity type impurity concentration of the maximum value point is at least twenty times greater than a second conductivity type impurity concentration of the surface of said second well region.

24. A semiconductor device comprising:
a semiconductor substrate of a first conductivity type;
a semiconductor layer on a surface of said semiconductor substrate;
a source electrode on a surface of said semiconductor layer;
a drain electrode on a rear surface of said semiconductor substrate; and
a gate electrode forming a channel region in said semiconductor layer;
wherein said semiconductor layer comprises:
a first conductivity region on said surface of said semiconductor substrate;
a plurality of first well regions of a second conductivity type on said first conductivity region, facing said gate electrode with an insulating film therebetween;
a source region of the first conductivity type in a surface region of each of said first well regions, connected to said source electrode; and
a second well region of the second conductivity type in said semiconductor layer which is vertically overlapped by the gate electrode, the second well region of the second conductivity type in said semiconductor layer overlapping the drain electrode,
wherein a second conductivity type impurity concentration profile of said second well region includes a maximum value point, which is at a position which is not vertically overlapped by the first well region, which is deeper than a surface of said second well region between said gate electrode and said drain electrode, and
wherein a region of the first conductivity type overlies said second well region.

* * * * *